United States Patent
Shiratori et al.

(10) Patent No.: US 10,431,775 B2
(45) Date of Patent: Oct. 1, 2019

(54) ORGANIC EL DEVICE, METHOD FOR MANUFACTURING ORGANIC EL DEVICE, AND ELECTRONIC INSTRUMENT

(71) Applicant: SEIKO EPSON CORPORATION, Tokyo (JP)

(72) Inventors: Koya Shiratori, Matsumoto (JP); Takeshi Koshihara, Matsumoto (JP); Ryoichi Nozawa, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 40 days.

(21) Appl. No.: 15/612,523

(22) Filed: Jun. 2, 2017

(65) Prior Publication Data
US 2017/0352842 A1    Dec. 7, 2017

(30) Foreign Application Priority Data
Jun. 6, 2016 (JP) ................ 2016-112552

(51) Int. Cl.
H01L 51/52 (2006.01)
H01L 27/32 (2006.01)
H01L 51/50 (2006.01)

(52) U.S. Cl.
CPC ...... *H01L 51/5275* (2013.01); *H01L 27/3211* (2013.01); *H01L 51/5012* (2013.01); *H01L 51/5206* (2013.01); *H01L 51/5221* (2013.01); *H01L 51/5253* (2013.01); *H01L 51/5265* (2013.01); *H01L 51/5271* (2013.01); *H01L 2251/303* (2013.01)

(58) Field of Classification Search
CPC ........... H01L 27/3211; H01L 27/322; H01L 27/3206; H01L 51/5253; H01L 51/5271; H01L 51/5275
See application file for complete search history.

(56) References Cited

U.S. PATENT DOCUMENTS

| | | | |
|---|---|---|---|
| 2007/0273279 A1* | 11/2007 | Kobayashi | H01L 51/5265 313/507 |
| 2011/0120755 A1* | 5/2011 | Lee | H01L 27/1214 174/254 |
| 2014/0353635 A1* | 12/2014 | Chou | H01L 27/3211 257/40 |
| 2014/0361316 A1 | 12/2014 | Nozawa et al. | |
| 2015/0001558 A1* | 1/2015 | Nozawa | H01L 51/5265 257/88 |
| 2015/0060807 A1 | 3/2015 | Koshihara et al. | |

(Continued)

FOREIGN PATENT DOCUMENTS

| | | |
|---|---|---|
| JP | 2014-235959 A | 12/2014 |
| JP | 2015-046239 A | 3/2015 |

(Continued)

*Primary Examiner* — Zandra V Smith
*Assistant Examiner* — John M Parker
(74) *Attorney, Agent, or Firm* — Oliff PLC

(57) ABSTRACT

An organic EL device has at least a first pixel and a second pixel different in the optical path length, in which the first pixel and the second pixel have a reflective layer, a protective layer, an optical path length adjusting layer, a first electrode, a light emitting function layer, and a second electrode, and the optical path length adjusting layer is an insulating layer and has a refractive index higher than a refractive index of the protective layer.

22 Claims, 17 Drawing Sheets

(56) References Cited

U.S. PATENT DOCUMENTS

| | | | |
|---|---|---|---|
| 2016/0190504 A1 | 6/2016 | Koshihara | |
| 2016/0190520 A1 * | 6/2016 | Koshihara | |
| 2018/0083226 A1 * | 3/2018 | Ichikawa | H01L 27/322 |
| 2018/0323403 A1 * | 11/2018 | Nozawa | H01L 51/5271 |

FOREIGN PATENT DOCUMENTS

| | | |
|---|---|---|
| JP | 2016-122138 A | 7/2016 |
| JP | 2016-122612 A | 7/2016 |
| JP | 2016-122613 A | 7/2016 |
| JP | 2016-122614 A | 7/2016 |
| JP | 2016-170936 A | 9/2016 |

\* cited by examiner

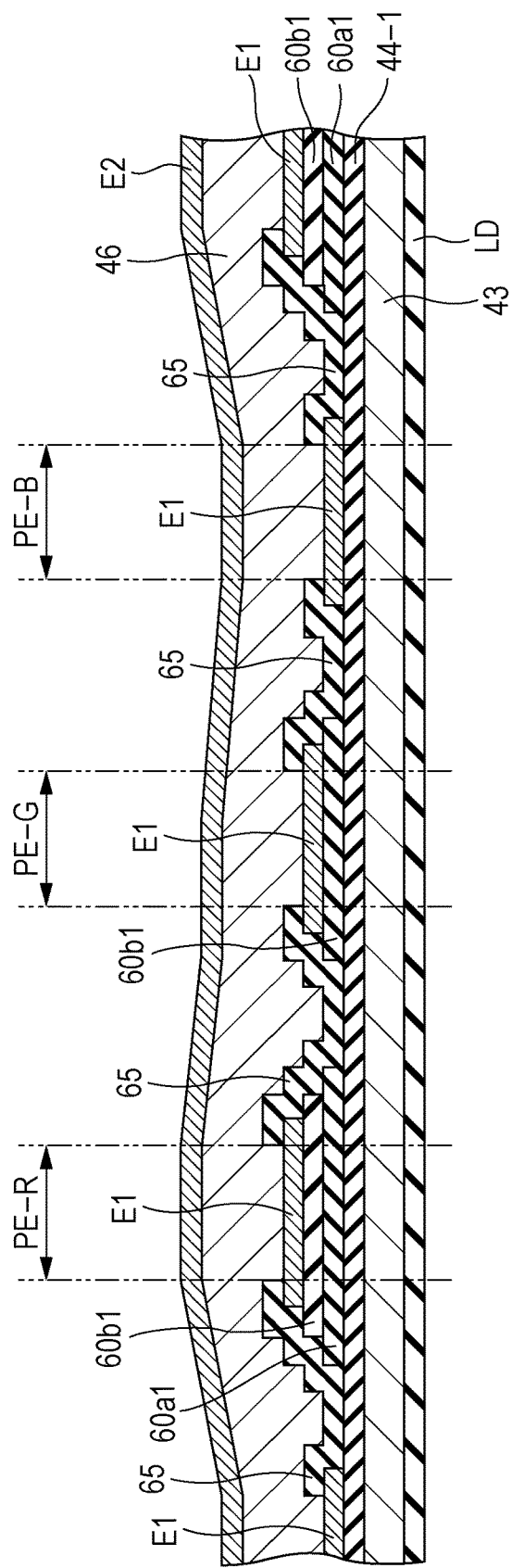

<COMPARATIVE EXAMPLE 1>

<COMPARATIVE EXAMPLE 2>

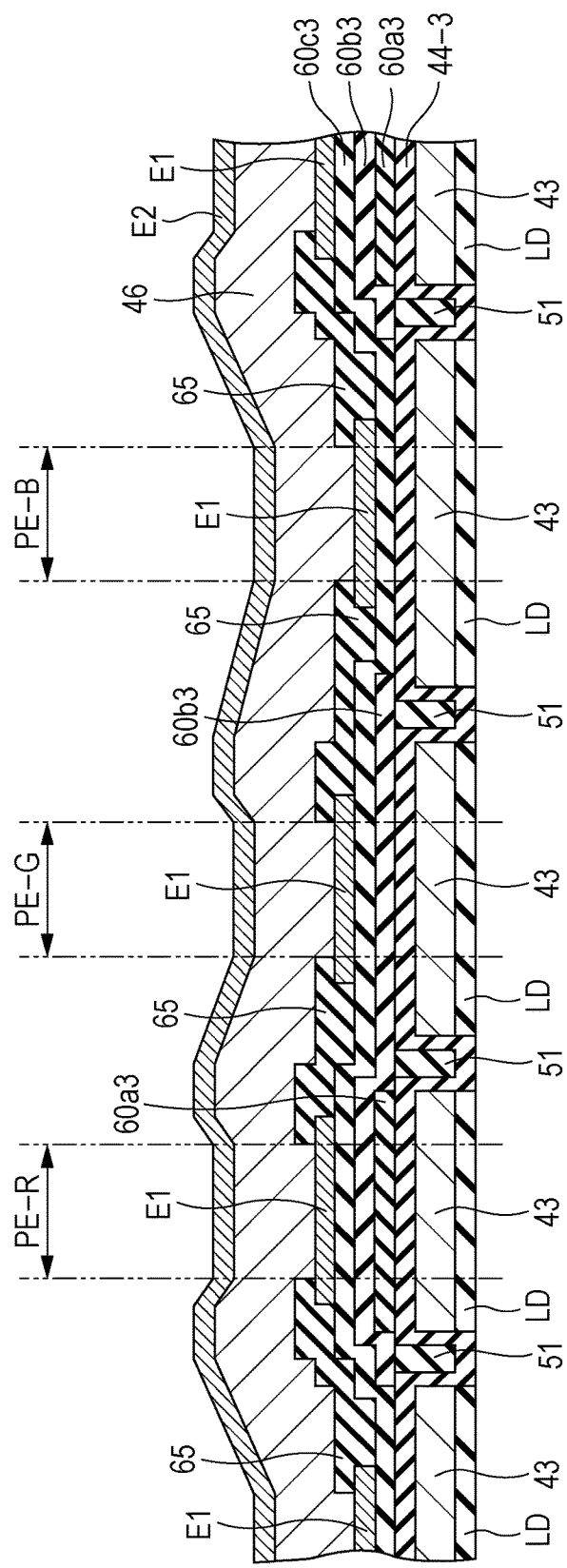

⟨EXAMPLE 1⟩

<EXAMPLE 2>

<EXAMPLE 3>

<EXAMPLE 4>

FIG. 13

| LEVEL DIFFERENCE BETWEEN PIXELS [nm] | COMPARATIVE EXAMPLE 1 | COMPARATIVE EXAMPLE 2 | EXAMPLE 1 | EXAMPLE 2 | EXAMPLE 3 | EXAMPLE 4 |
|---|---|---|---|---|---|---|
| R-G | 55 | 56 | 46 | 46 | 44 | 51 |
| G-B | 35 | 44 | 35 | 35 | 34 | 37 |
| B-R | 90 | 100 | 81 | 81 | 78 | 88 |

FIG. 14

| RELIABILITY EVALUATION | COMPARATIVE EXAMPLE 1 | COMPARATIVE EXAMPLE 2 | EXAMPLE 1 | EXAMPLE 2 | EXAMPLE 3 | EXAMPLE 4 |
|---|---|---|---|---|---|---|
| LEFT AT 85°C85% | 1500 h | 1200 h | 1900 h | 1800 h | 1900 h | 1500 h |

# ORGANIC EL DEVICE, METHOD FOR MANUFACTURING ORGANIC EL DEVICE, AND ELECTRONIC INSTRUMENT

BACKGROUND

1. Technical Field

The present invention relates to the technical fields of an organic EL device, a method for manufacturing an organic EL device, and an electronic instrument.

2. Related Art

In recent years, in an electronic instrument enabling the formation of a virtual image, such as a head mounted display, an organic EL (Electro Luminescence) device using an OLED (Organic Light Emitting Diode) as a light emitting element has been used. As an example of such an organic EL device, a device which has a reflective layer in each pixel and which performs optical path length adjustment according to the optical distance between the reflective layer and a pixel electrode by a cavity structure has been proposed as in JP-A-2014-235959.

In the device having the structure as in JP-A-2014-235959, silicon nitride (SiN) having high etching selectivity is used as a protective layer for protecting a transistor and the like provided in a pixel and the optical path length adjustment is performed by silicon oxide ($SiO_2$) on the protective layer. A pixel electrode is formed of ITO (indium tin oxide) in a layer on the silicon oxide ($SiO_2$). Therefore, a difference between the refractive index of the silicon nitride (SiN) and the refractive index of the silicon oxide ($SiO_2$) is large and a difference between the refractive index of the silicon oxide ($SiO_2$) and the refractive index of the ITO (indium tin oxide) increases. Thus, in the configuration of JP-A-2014-235959, a refractive index interface, which is an interface between two layers having a large refractive index difference, increases, and therefore the luminosity has sometimes decreased as compared with the case where the optical path length adjustment is performed using ITO (indium tin oxide) having a refractive index close to that of the silicon nitride (SiN).

The optical distance is obtained by the product of the refractive index and the film thickness. Therefore, when the optical path length adjustment is performed with silicon oxide ($SiO_2$) having a low refractive index, the film thickness of the optical path length adjusting layer increases, which has sometimes resulted in an increase in a level difference between pixels. Therefore, there is a possibility that a sealing film may be damaged. Moreover, due to the increase in the level difference between pixels, a thin portion is locally generated in the OLED layer, and, when the luminosity is low, an excessive current flows to the outside of the pixels, so that the color stability has sometimes decreased.

SUMMARY

The present invention solves at least part of the above-described problems and provides an organic EL device which does not cause luminosity reduction even when the optical path length adjustment is performed using an insulating film, a method for manufacturing the organic EL device, and an electronic instrument or an organic EL device capable of reducing the level difference between pixels, a method for manufacturing the organic EL device, and an electronic instrument.

In order to solve the above-described problems, one aspect of an organic EL device of the present invention is an organic EL device having a first pixel and a second pixel different in the optical path length, in which the first pixel and the second pixel have a reflective layer, a first electrode, a second electrode, a light emitting function layer provided between the first electrode and the second electrode, a protective layer provided between the first electrode and the reflective layer, and an optical path length adjusting layer provided between the first electrode and the protective layer and having a different film thickness in the first pixel and the second pixel, and the optical path length adjusting layer is an insulating layer and has a refractive index higher than the refractive index of the protective layer.

According to this aspect, the refractive index of the optical path length adjusting layer is higher than the refractive index of the protective layer, and therefore, as compared with a case where the refractive index of the optical path length adjusting layer is lower than the refractive index of the protective layer, the layer thickness of the optical path length adjusting layer for obtaining a desired optical path length can be reduced. As a result, a level difference between the pixels increases, so that the color stability and the reliability can be increased.

The organic EL device according to one aspect described above may be characterized in that a difference between the refractive index of the first electrode and the refractive index of the optical path length adjusting layer is smaller than a difference between the refractive index of the first electrode and the refractive index of the protective layer.

According to this aspect, a difference between the refractive index of the first electrode and the refractive index of the optical path length adjusting layer provided on a side closer to the first electrode relative to the protective layer is smaller than the difference between the refractive index of the first electrode and the refractive index of the protective layer. Therefore, according to this aspect, as compared with a case where the difference between the refractive index of the first electrode and the refractive index of the optical path length adjusting layer is larger than the difference between the refractive index of the first electrode and the refractive index of the protective layer, the difference between the refractive index of the first electrode and the refractive index of the optical path length adjusting layer can be made small. Thus, as compared with the case where the difference between the refractive index of the first electrode and the refractive index of the optical path length adjusting layer is larger than the difference between the refractive index of the first electrode and the refractive index of the protective layer, the refractive index interface can be reduced. As a result, the luminosity reduction can be prevented.

In one aspect of the organic EL device described above, the protective layer may be in contact with the reflective layer. According to this aspect, the protective layer contacts the reflective layer and also functions as a reflection enhancing film, and therefore the luminosity reduction is further prevented. Moreover, according to this aspect, as compared with a case where the refractive index of the protective layer is higher than the refractive index of the optical path length adjusting layer, a possibility that the refractive index can be lowered in a portion closer to the reflection plane of the reflective layer increases, and therefore a possibility that the utilization ratio of light to be extracted can be improved increases.

In one aspect of the organic EL device described above, the protective layer may be a silicon oxide film ($SiO_2$). According to this aspect, the protective layer is a silicon oxide film ($SiO_2$), and therefore a silicon nitride film (SiN) having a refractive index higher than the refractive index of the silicon oxide film ($SiO_2$), for example, is used as the optical path length adjusting layer. As a result, the luminosity reduction can be prevented. Moreover, the layer thickness of the optical path length adjusting layer for obtaining a desired optical path length can be reduced. As a result, the level difference between pixels decreases, so that the color stability and the reliability can be increased.

In one aspect of the organic EL device described above, the optical path length adjusting layer may contain any material of silicon nitride (SiN), titanium oxide (TiOx), tantalum oxide (TaOx), aluminum oxide (AlCx), molybdenum oxide (MoOx), tungsten oxide (WOx), and hafnium oxide (HfOx). According to this aspect, the refractive index of the optical path length adjusting layer can be made higher than the refractive index of the protective layer and the luminosity reduction can be prevented. According to this aspect, as compared with the case where a silicon oxide film ($SiO_2$), for example, is used as the optical path length adjusting layer, the layer thickness of the optical path length adjusting layer for obtaining a desired optical path length can be reduced. As a result, a level difference between the pixels decreases, so that the color stability and the reliability can be increased.

In one aspect of the organic EL device described above, a third pixel may be contained besides the first pixel and the second pixel, and the third pixel may not contain the optical path length adjusting layer. According to this aspect, the third pixel does not contain the optical path length adjusting layer, and therefore a manufacturing process can be simplified. The layer thickness of the protective layer can be increased corresponding to the thickness obtained due to the fact that the third pixel does not contain the optical path length adjusting layer, so that a risk in terms of a manufacturing process can be reduced.

In order to solve the above-described problems, one aspect of an organic EL device of the present invention is an organic EL device having a first pixel and a second pixel different in the optical path length, in which the first pixel and the second pixel have a reflective layer, a first electrode, a second electrode, a light emitting function layer provided between the first electrode and the second electrode, an optical path length adjusting layer provided between the first electrode and the reflective layer and having a different film thickness in the first pixel and the second pixel, and a protective layer provided between the reflective layer and the optical path length adjusting layer, the optical path length adjusting layer is an insulating layer, and a difference between the refractive index of the first electrode and the refractive index of the optical path length adjusting layer is smaller than a difference between the refractive index of the first electrode and the refractive index of the protective layer.

According to this aspect, as compared with a case where the difference between the refractive index of the first electrode and the refractive index of the optical path length adjusting layer is larger than the difference between refractive index of the first electrode and the refractive index of the protective layer, the difference between the refractive index of the first electrode and the refractive index of the optical path length adjusting layer can be made small. Therefore, according to this aspect, as compared with the case where the difference between the refractive index of the first electrode and the refractive index of the optical path length adjusting layer is larger than the difference between the refractive index of the first electrode and the refractive index of the protective layer, the refractive index interface can be reduced. As a result, the luminosity reduction can be prevented.

The refractive index of the optical path length adjusting layer is approximately equal to the refractive index of the first electrode. Specifically, the difference between the refractive index of the optical path length adjusting layer and the refractive index of the first electrode is preferably within 0.1.

In order to solve the above-described problems, one aspect of a method for manufacturing an organic EL device of the present invention is a method for manufacturing an organic EL device having a first pixel and a second pixel different in the optical path length and includes a process of forming a reflective layer, a process of forming a protective layer, a process of forming an optical path length adjusting layer having a different film thickness in the first pixel and the second pixel with an insulating material, a process of forming a first electrode, a process of forming a light emitting function layer, and a process of forming a second electrode, in which the refractive index of the optical path length adjusting layer is higher than the refractive index of the protective layer.

According to this aspect, the refractive index of the optical path length adjusting layer is higher than the refractive index of the protective layer, and therefore, as compared with a case where the refractive index of the optical path length adjusting layer is lower than the refractive index of the protective layer, the layer thickness of the optical path length adjusting layer for obtaining a desired optical path length can be reduced. As a result, a level difference between the pixels decreases, so that the color stability and the reliability can be increased.

In order to solve the above-described problems, one aspect of a method for manufacturing an organic EL device of the present invention is a method for manufacturing an organic EL device having a first pixel and a second pixel different in the optical path length and includes a process of forming a reflective layer, a process of forming a protective layer, a process of forming an optical path length adjusting layer having a different film thickness in the first pixel and the second pixel with an insulating material, a process of forming a first electrode, a process of forming a light emitting function layer, and a process of forming a second electrode, in which a difference between the refractive index of the first electrode and the refractive index of the optical path length adjusting layer is smaller than a difference between the refractive index of the first electrode and the refractive index of the protective layer.

According to this aspect, the refractive index of the optical path length adjusting layer is higher than the refractive index of the protective layer, and therefore, as compared with a case where the refractive index of the optical path length adjusting layer is lower than the refractive index of the protective layer, the layer thickness of the optical path length adjusting layer for obtaining a desired optical path length can be reduced. As a result, a level difference between the pixels decreases, so that the color stability and the reliability can be increased.

The refractive index of the optical path length adjusting layer is preferably equal to the refractive index of the first electrode. Specifically, the difference between the refractive index of the optical path length adjusting layer and the refractive index of the first electrode is preferably within 0.1.

Next, an electronic instrument according to the present invention has the organic EL device according to the present invention described above. With respect to such an electronic instrument, an electronic instrument having high luminosity and having improved color stability and reliability is provided by an organic EL device having a light emitting element, such as an OLED.

BRIEF DESCRIPTION OF THE DRAWINGS

The invention will be described with reference to the accompanying drawings, wherein like numbers reference like elements.

FIG. 5A is a cross sectional view in the row direction of pixels in a display area of an electrooptical device of Comparative Example 1.

FIG. 7A is a cross sectional view in the row direction of pixels in a display area of an electrooptical device of Example 1.

FIG. 13 is a view illustrating the level difference between the pixels in the electrooptical device of each Example and each Comparative Example.

FIG. 14 is a view illustrating the evaluation result of the reliability in the electrooptical device of each Example and each Comparative Example.

DESCRIPTION OF EXEMPLARY EMBODIMENTS

Embodiments of the present invention are described with reference to the drawings. In the following drawings, in order to illustrate each layer and each member in a recognizable size on the drawings, the scale is differentiated in each layer and each member.

Figure 1:
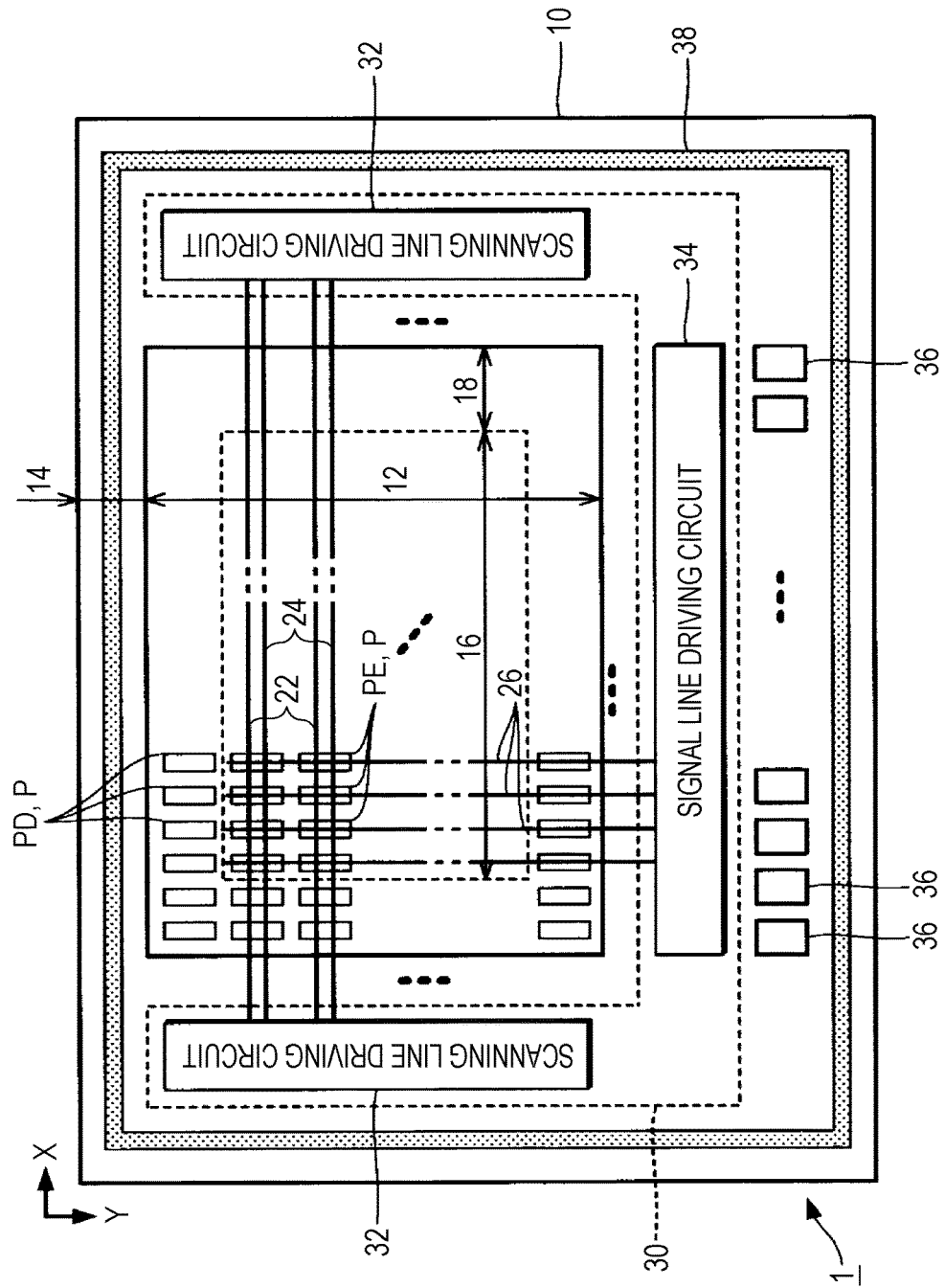
FIG. 1 is a plan view illustrating an electrooptical device according to one embodiment of the present invention.

FIG. 1 is a plan view of an electrooptical device 1 according to one embodiment of the present invention. The electrooptical device 1 of this embodiment is an organic EL device in which light emitting elements utilizing organic EL materials are formed on the surface of a substrate 10. The substrate 10 is a plate-like member (semiconductor substrate) formed of a semiconductor material, such as silicon, a glass substrate, or the like and is used as a base substance (base) on which a plurality of light emitting elements are formed. As illustrated in FIG. 1, the surface of the substrate 10 is divided into a first area 12 and a second area 14. The first area 12 is a rectangular area and the second area 14 is a rectangular frame-like area surrounding the first area 12.

In the first area 12, a plurality of scanning lines 22 extending in the row direction (X direction), a plurality of control lines 24 extending in the row direction (X direction) corresponding to the scanning lines 22, and a plurality of signal lines 26 extending in the column direction (Y direction) crossing the row direction (X direction). Pixels P (PD, PE) are formed corresponding to the crossings between the plurality of scanning lines 22 and the plurality of signal lines 26. Therefore, the plurality of pixels P are arranged in a matrix over the row direction (X direction) and over the column direction (Y direction).

In the second area 14, a driving circuit 30, a plurality of mounting terminals 36, and a guard ring 38 are disposed. The driving circuit 30 is a circuit driving each pixel P and containing two scanning line driving circuits 32 disposed at positions sandwiching the first area 12 in the row direction (X direction) and a signal line driving circuit 34 disposed in an area extending in the row direction (X direction) of the second area 14. The plurality of mounting terminals 36 are formed in an area opposite to the first area 12 with the signal line driving circuit 34 interposed therebetween and are electrically connected to external circuits (for example, an electronic circuit mounted on a wiring board), such as a control circuit and a power supply circuit, via a flexible wiring board (not illustrated) joined to the substrate 10.

With respect to the electrooptical device 1 of this embodiment, an original substrate of a size equal to the size of two or more of the substrates 10 is cut (scribed), whereby a plurality of pieces thereof are formed in batch. The guard ring 38 of FIG. 1 prevents the spread of the impact in the cutting of the original substrate and the influence of static electricity on the driving circuit 30 or each pixel P and the entrance of moisture from an end surface (cut surface of the original substrate) of each substrate 10. As illustrated in FIG. 1, the guard ring 38 is formed into an annular shape (rectangular frame-like shape) surrounding the driving circuit 30, the plurality of mounting terminals 36, and the first area 12.

The first area 12 of FIG. 1 is divided into a display area 16 and a peripheral area 18. The display area 16 is an area where an image is actually displayed by the driving of each pixel P. The peripheral area 18 is a rectangular frame-like area surrounding the display area 16 and pixels P (hereinafter referred to as "dummy pixel PD") having a structure similar to the structure of the pixels P in the display area 16 but, in actual, not contributing to the display of an image are disposed. From the viewpoint of clarifying the distinction in description from the dummy pixel PD in the peripheral area 18, the pixel P in the display area 16 is described as a "display pixel PE" in the following description. The display pixel PE is an element serving as the minimum unit for light emission.

Figure 2:
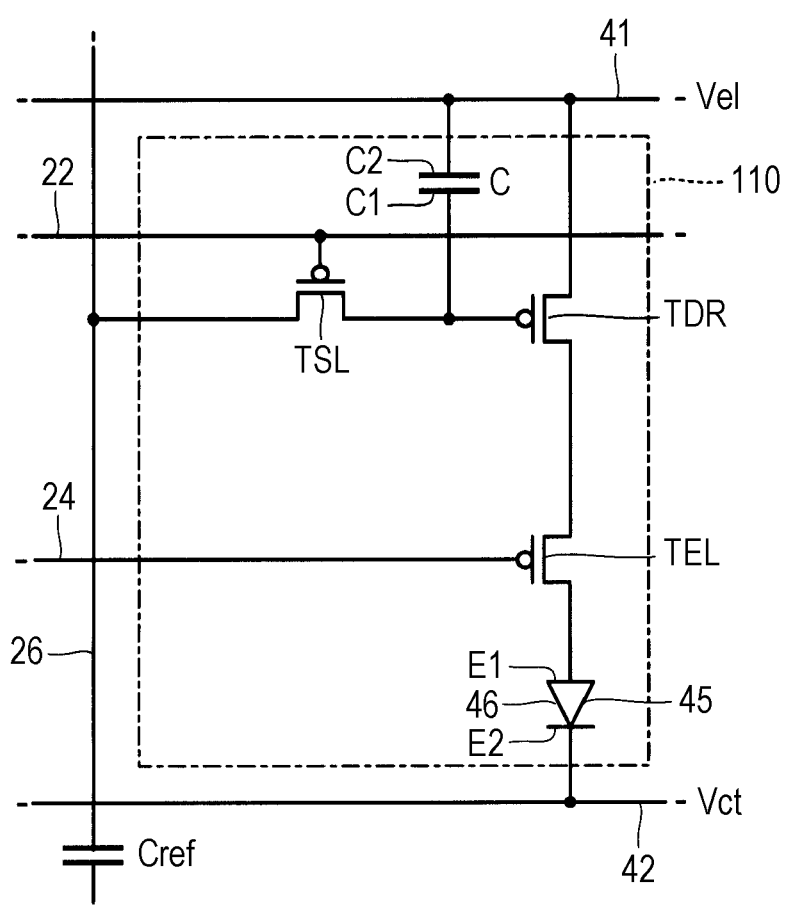
FIG. 2 is a circuit diagram of display pixels located in a display area.

FIG. 2 is a circuit diagram of each display pixel PE located in the display area 16. As illustrated in FIG. 2, the display pixel PE contains a light emitting element 45, a drive transistor TDR, a light emission control transistor TEL, a selecting transistor TSL, and a capacity element C. In this embodiment, the transistors T (TDR, TEL, TSL) of the display pixel PE are P-channel types but N-channel type transistors are also usable.

The light emitting element 45 is an electrooptical element in which a light emitting function layer 46 containing a light emitting layer of an organic EL material is interposed between a first electrode (anode) E1 and a second electrode (cathode) E2. A first electrode E1 is individually formed in each display pixel PE and the second electrode E2 continues over the plurality of pixels P. As is understood from FIG. 2, the light emitting element 45 is disposed on a path connecting a first power supply conductor 41 and a second power supply conductor 42. The first power supply conductor 41 is a power supply wiring line to which a power supply potential VEL on a high potential side is supplied. The second power supply conductor 42 is a power supply wiring line to which a power supply potential (for example, ground potential) VCT on a low potential side is supplied.

The drive transistor TDR and the light emission control transistor TEL are disposed in series to the light emitting element 45 on the path connecting the first power supply conductor 41 and the second power supply conductor 42. Specifically, one end (source) of a pair of current terminals of the drive transistor TDR is connected to the first power supply conductor 41. The light emission control transistor TEL functions as a switch controlling the conductive state (conductive/non-conductive) of the other end (drain) of the pair of current terminals of the drive transistor TDR and the first electrode E1 of the light emitting element 45. The drive transistor TDR generates a drive current of the current amount according to the voltage between the gate and the source thereof. In a state where the light emission control transistor TEL is controlled to the ON state, the drive current is supplied to the light emitting element 45 via the light emission control transistor TEL from the drive transistor TDR, whereby the light emitting element 45 emits light with the luminosity according to the current amount of the drive current. In a state where the light emission control transistor TEL is controlled to the OFF state, the supply of the drive current to the light emitting element 45 is interrupted, whereby the light emitting element 45 is turned off. The gate of the light emission control transistor TEL is connected to a control line 24.

The selecting transistor TSL of FIG. 2 functions as a switch controlling the conductive state (conductive/non-conductive) of the signal line 26 and the gate of the drive transistor TDR. The gate of the selecting transistor TSL is connected to the scanning line 22. The capacity element C is an electrostatic capacity in which a dielectric is interposed between a first electrode C1 and a second electrode C2. The first electrode C1 is connected to the gate of the drive transistor TDR and the second electrode C2 is connected to the first power supply conductor 41 (source of the drive transistor TDR). Therefore, the capacity element C holds the voltage between the gate and the source of the drive transistor TDR.

The signal line driving circuit 34 supplies a gradation potential (data signal) according to the gradation, which an image signal supplied from an external circuit specifies in each display pixel PE, to the plurality of signal lines 26 in parallel in each writing period (horizontal scanning period). On the other hand, each scanning line driving circuit 32 supplies a scanning signal to each scanning line 22 to thereby select each of the plurality of scanning lines 22 one by one in each writing period. The selecting transistor TSL of each display pixel PE corresponding to the scanning line 22 selected by the scanning line driving circuit 32 shifts to the ON state. Therefore, the gradation potential is supplied to the gate of the drive transistor TDR of each display pixel PE via the signal line 26 and the selecting transistor TSL, and a voltage according to the gradation potential is held in the capacity element C. On the other hand, when the selection of the scanning line 22 in the writing period is completed, each scanning line driving circuit 32 supplies a control signal to each control line 24 to thereby control the light emission control transistor TEL of each display pixel PE corresponding to the control line 24 to the ON state. Therefore, the drive current according to the voltage held in the capacity element C in the immediately preceding writing is supplied to the light emitting element 45 via the light emission control transistor TEL from the drive transistor TDR. Due to the fact that each light emitting element 45 emits light with the luminosity according to the gradation potential as described above, an arbitrary image specified by the image signal is displayed in the display area 16.

Figure 3:
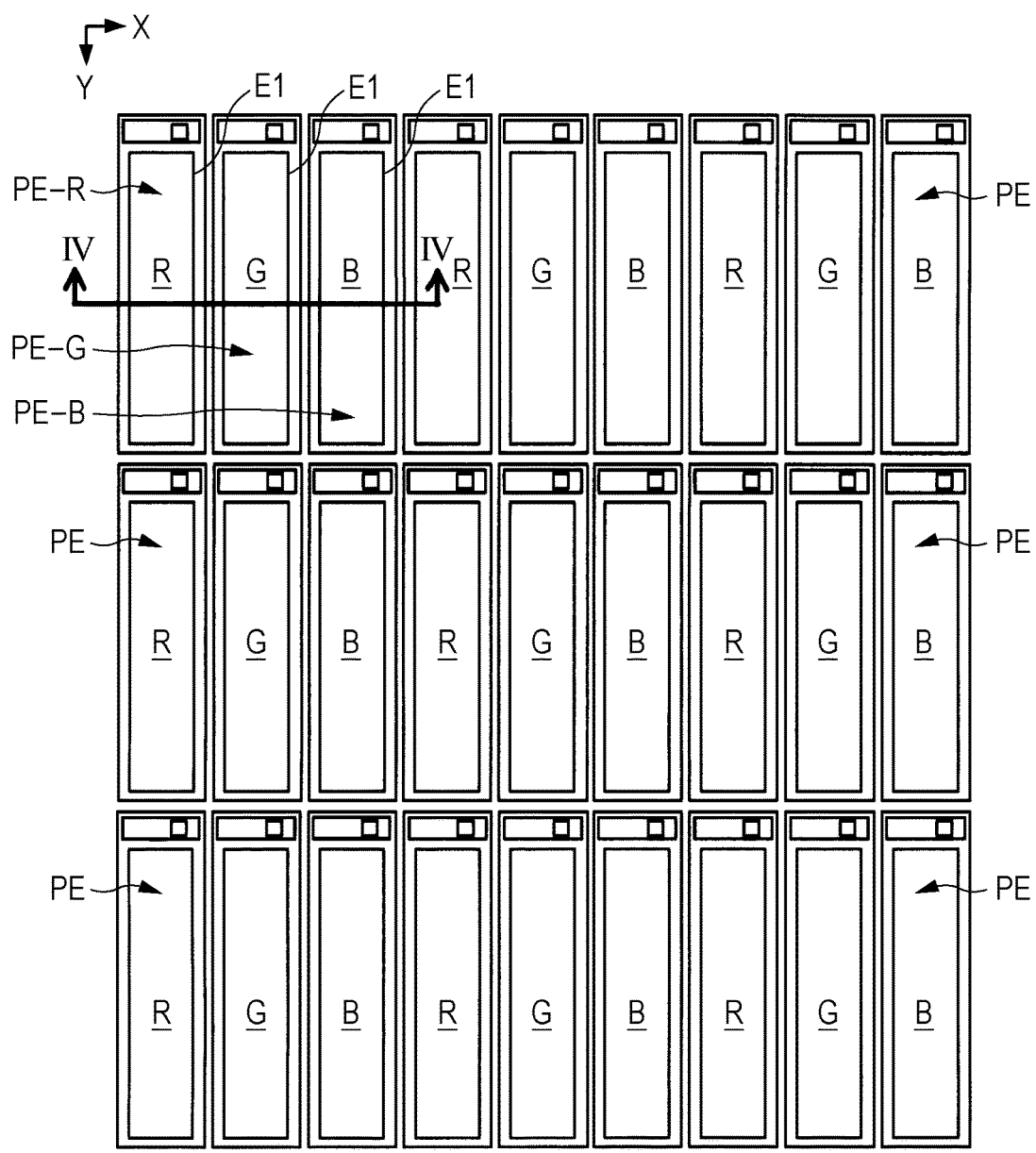
FIG. 3 is a plan view of a part of the display area.

Hereinafter, a specific structure of the electrooptical device 1 of this embodiment is described in detail. In each drawing referred to in the following description, the size and the scale of each element are differentiated from those in the actual electrooptical device 1 for the convenience of the description. FIG. 3 is a plan view of a part of the display area 16. As illustrated in FIG. 3, the display pixels PE are disposed in a matrix in the display area 16. In the display area 16, an image is actually displayed by the driving of each pixel PE.

Figure 4:
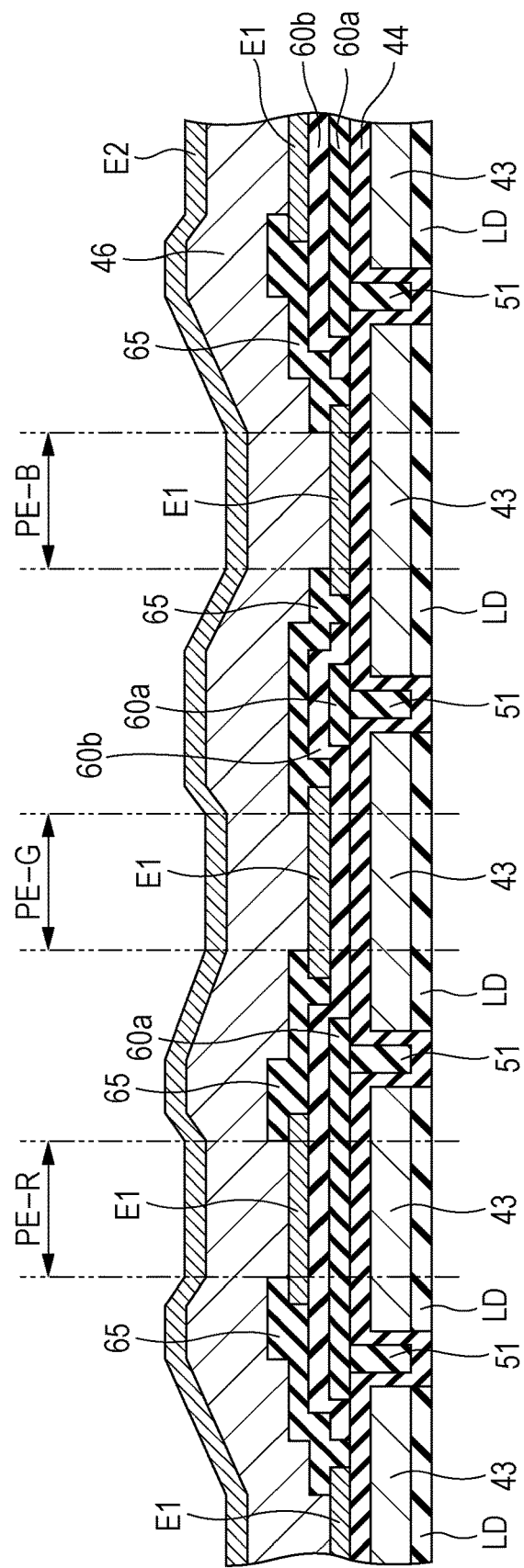
FIG. 4 is a cross sectional view in the row direction of pixels in the display area.

FIG. 4 is a cross sectional view corresponding to the cross section containing the IV-IV line in FIG. 3. Two or more of the display pixels PE provided in the electrooptical device 1 are classified into a red (R) subpixel PE-R as a first pixel, a green (G) subpixel PE-G as a second pixel, and a blue (B) subpixel PE-B as a third pixel. As is understood from FIG. 3, in the display area 16, the subpixel, the subpixel PE-G, and the subpixel PE-B are repeatedly arranged along the row direction (X direction) in this order at predetermined intervals. In the column direction (Y direction), the subpixels of the same color are disposed at predetermined intervals.

In FIG. 4 illustrating the structure of the electrooptical device 1 in the display area 16, the bottom layer is shown as an insulating layer LD for convenience. Although not illustrated, the transistors T (TDR, TEL, TSL) of the display pixel PE are formed in a lower layer of the insulating layer LD in the display area 16. Specifically, an active area (source/drain area) of the transistors T (TDR, TEL, TSL) of the display pixel PE is formed on the surface of the substrate 10 formed of a semiconductor material, such as silicon. The surface of the substrate 10 on which the active area is formed is covered with a gate insulating film, and the gate of each transistor T is formed on the surface of the insulating film. The gate of each transistor T faces the active layer with the insulating film interposed therebetween. On the surface of the insulating film on which the gate of each transistor T is formed, a multilayer wiring layer is formed in which an insulating layer and a conductive layer (wiring layer) are alternately laminated. The insulating layers are formed of inorganic insulating materials, such as silicon compounds (typically silicon nitride and silicon oxide), for example. In the following description, the relationship in which a plurality of elements are formed in batch by the same process by the selective removal of a conductive layer (single layer or a multiple layer) or an insulating layer (single layer or a multiple layer) is described as "formed from the same layer".

The first power supply conductor 41 and the second power supply conductor 42 are formed in an upper layer of the layer on which the gate of each transistor T is formed. The first power supply conductor 41 is formed in the display area 16 of the first area 12 and the second power supply conductor 42 is formed in the peripheral area 18 of the first area 12. The first power supply conductor 41 and the second power supply conductor 42 are formed apart from each other and are electrically insulated. The first power supply conductor 41 is conductive to the mounting terminals 36 to which a power supply potential VEL on a high potential side is supplied via a wiring line (not illustrated) in the multilayer wiring layer. Similarly, the second power supply conductor 42 is conductive to the mounting terminals 36 to which the power supply potential VCT on a low potential side is supplied via a wiring line (not illustrated) in the multilayer wiring layer. The first power supply conductor 41 and the second power supply conductor 42 of this embodiment are formed with a film thickness of about 100 nm with a light reflective conductive material containing silver or aluminum, for example.

The insulating layer LD illustrated in FIG. 4 is formed in an upper layer of the layer on which the first power supply conductor 41 and the second power supply conductor 42 are formed. As illustrated in FIG. 4, a reflective layer 43 is formed on the surface of the insulating layer LD in the display area 16. The reflective layer 43 is formed of a light reflective conductive material, such as aluminum, for example. The reflective layer 43 is formed extending in the column direction (Y direction) in each of the blue (B), green (G), and red (R) subpixels as illustrated in FIG. 4. The reflective layer 43 forms a rectangular area as viewed in plan. The reflective layers 43 are disposed at predetermined intervals in the row direction (X direction) and in the column direction (Y direction).

As is understood from FIG. 4, a protective layer 44 is formed in an upper layer of the reflective layer 43. In this embodiment, the protective layer 44 is formed of silicon oxide ($SiO_2$), and silicon dioxide is preferable. The protective layer 44 is a layer formed for preventing damages to the layer on which the transistors T described above are formed in etching in the formation of an optical adjusting layer to be provided in an upper layer of the protective layer 44.

In this embodiment, the protective layer 44 is disposed so as to contact the reflective layers 43 as illustrated in FIG. 4. Although the details are described later, the optical adjusting layer and the protective layer 44 are provided so that the refractive index of the optical adjusting layer is higher than the refractive index of the protective layer 44. Therefore, in this embodiment, as compared with a case where the refractive index of the optical adjusting layer is lower than the refractive index of the protective layer 44, the refractive index can be lowered in a portion (protective layer 44) closer to the reflection plane of the reflective layer 43, and the utilization ratio of light to be extracted can be increased.

More specifically, the reflection characteristics of the reflective layers 43 can be improved.

For example, when the reflective layer 43 is formed containing aluminum and the protective layer 44 is formed of silicon nitride (SiN) having a refractive index of 1.8 thereon, the reflectance at a wavelength of 550 nm is 86.8%. On the other hand, in this embodiment, the protective layer 44 is formed as silicon oxide ($SiO_2$) having a refractive index of 1.45, for example. In such a case, the reflectance at a wavelength of 550 nm is 89.0%. Moreover, the reflectance at other wavelength bands of visible light increases by about 2 to 3% in the case where the protective layer 44 is formed as silicon oxide ($SiO_2$) having a refractive index of 1.45 as with this embodiment as compared with a case where the protective layer 44 is formed as silicon nitride (SiN) having a refractive index of 1.8. In the invention of this application, the resonance structure is adopted, and therefore, multiple reflection occurs between the reflective layer 43 and the second electrode E2, so that the reflectance on the interface between the reflective layer 43 and the protective layer 44 has considerable influence on the intensity of light to be extracted.

Since the protective layer 44 is formed so as to contact the reflective layers 43, concave portions are formed corresponding to the gaps between the reflective layers 43 adjacent to each other in the row direction (X direction) and in the column direction (Y direction) in the display area 16 as illustrated in FIG. 4. In the concave portions, embedded oxide layers 51 are embedded as illustrated in FIG. 4. The embedded oxide layers 51 are formed of silicon dioxide ($SiO_2$), for example.

On the surface of the protective layer 44 and the embedded oxide layers 51, first optical path length adjusting layers 60a as an island-shaped insulating layer are formed as illustrated in FIG. 4. In the subpixel PE-R, a second optical path length adjusting layer 60b as an island-shaped insulating layer is formed on the surface of the first optical path length adjusting layer 60a. In the subpixel PE-G, a second optical path length adjusting layer 60b as an island-shaped insulating layer is formed on the surface of the protective layer 44. In the subpixel PE-B, no optical path length adjusting layer is formed. The first optical path length adjusting layer 60a and the second optical path length adjusting layer 60b are light transmitting film bodies specifying the resonance wavelength (i.e., display color) of the resonance structure of each display pixel PE. The "optical path length adjusting layer" in Claims is a general term for the first optical path length adjusting layer 60a and the second optical path length adjusting layer 60b. In this embodiment, the optical path length adjusting layer is formed of a material which reduces the difference between the refractive index of the optical path length adjusting layer and the refractive index of the first electrode E1 is smaller than the difference between the refractive index of the protective layer 44 and the refractive index of the first electrode E1. The first optical path length adjusting layer 60a and the second optical path length adjusting layer 60b are formed from silicon nitride (SiN) in this embodiment. The details of the resonance structure and the first optical path length adjusting layer 60a and the second optical path length adjusting layer 60b of each display pixel PE are described later.

On the surface of the first optical path length adjusting layer 60a or the second optical path length adjusting layer 60b, a first electrode E1 is formed in each display pixel PE in the display area 16 as illustrated in FIG. 4. The first electrode E1 is formed of a light transmitting conductive material, such as ITO (Indium Tin Oxide), in this embodiment. The first electrode E1 is an approximately rectangular electrode (pixel electrode) functioning as the anode of the light emitting element 45 as described above with reference to FIG. 2. The first electrode E1 is conductive to the active area (drain) of the light emission control transistor TEL via a plurality of relay electrodes which are not illustrated.

On the surface of the first optical path length adjusting layer 60a or the second optical path length adjusting layer 60b on which the first electrode E1 is formed, pixel defining layers 65 are formed over the entire area of the substrate 10 as illustrated in FIG. 4. The pixel defining layers 65 are formed, for example, with inorganic insulating materials, such as silicon compounds (typically silicon nitride and silicon oxide). Although not illustrated, an opening portion corresponding to each first electrode E1 in the display area 16 and the peripheral area 18 is formed in the pixel defining layer 65. An area near the inner peripheral edge of the opening portion of the pixel defining layer 65 is overlapped with the peripheral edge of the first electrode E1. More specifically, the inner peripheral edge of the opening portion is located inside the peripheral edge of the first electrode E1 as viewed in plan. As is understood from the description above, the pixel defining layers 65 are formed in the shape of a lattice as viewed in plan.

On the surface of the first optical path length adjusting layer 60a or the second optical path length adjusting layer 60b on which the first electrode E1 and the pixel defining layer 65 are formed, a light emitting function layer 46 is formed. The light emitting function layer 46 is formed in the display area 16 of the first area 12 and continues over the plurality of display pixel PEs. The light emitting function layer contains a light emitting layer formed of an organic EL material, a hole injection layer injecting a hole into the light emitting layer, and an electron transporting layer transporting an electron to the light emitting layer and emits white light by the supply of a current. The light emitting layer may be a laminate of a red light emitting layer emitting light in a red wavelength band, a blue light emitting layer emitting light in a blue wavelength band, and a green light emitting layer emitting light in a green wavelength band or may be a laminate of an orange light emitting layer emitting light in an orange wavelength band and a blue light emitting layer emitting light in a blue wavelength band.

On the surface of the first optical path length adjusting layer 60a or the second optical path length adjusting layer 60b on which the light emitting function layer 46 is formed, a second electrode E2 is formed over the entire area of the first area 12 (the display area 16 and the peripheral area 18). The second electrode E2 functions as the cathode of the light emitting element 45 as described above with reference to FIG. 2. In this embodiment, the second electrode E2 is formed of an MgAg alloy and also functions as a transflective layer. An area (light emitting area) sandwiched between the first electrode E1 and the second electrode E2 inside each opening portion of the pixel defining layer 65 of the light emitting function layer 46 emits light. More specifically, a portion where the first electrode E1, the light emitting function layer 46, and the second electrode E2 are laminated inside the opening portion functions as the light emitting element 45. As is understood from the description above, the pixel defining layer 65 specifies the plane shape and the size (area which actually emits light) of the light emitting element 45 of each display pixel PE.

Although not illustrated, on the surface of the second electrode E2, a sealing body is formed over the entire area of the substrate 10. The sealing body is a light transmitting film body preventing the entrance of the open air or moisture by sealing each element formed on the substrate 10. Each mounting terminal 36 of FIG. 1 is exposed to the outside via the opening portion formed in an area connected to a flexible wiring board of the sealing body.

Although not illustrated, on the surface of the sealing layer, a color filter for each subpixel of the subpixel PE-R, the subpixel PE-G, and the subpixel PE-B is formed. On the surface of the color filter, a counter glass is formed. The electrooptical device 1 of this embodiment employs the top emission structure in which light is emitted to the upper layer side relative to the light emitting function layer 46.

The electrooptical device 1 of this embodiment is a microdisplay in which the light emitting elements 45 are very minutely disposed. For example, the area (area of one opening portion) of one light emitting element 45 is set to 40 $\mu m^2$ or less and the interval between the light emitting elements 45 adjacent to each other in the X direction is set to 0.5 $\mu m$ or more and 2.0 $\mu m$ or less.

The first optical path length adjusting layer 60a and the second optical path length adjusting layer 60b are selectively removed by etching according to the display color of each display pixel PE. Specifically, in the subpixel PE-B, the first optical path length adjusting layer 60a and the second optical path length adjusting layer 60b are removed. In the subpixel PE-G, due to the fact that the first optical path length adjusting layer 60a is removed, the optical path adjustment is performed by the second optical path length adjusting layer 60b. On the other hand, in the subpixel PE-R, the optical path adjustment is performed by the laminate of the first optical path length adjusting layer 60a and the second optical path length adjusting layer 60b. Between the subpixels, the first optical path length adjusting layer 60a and the second optical path length adjusting layer 60b are laminated on the surface of the embedded oxide layers 51.

In this embodiment, the protective layer 44 is formed of silicon oxide and the first optical path length adjusting layer 60a and the second optical path length adjusting layer 60b on the protective layer 44 are formed of silicon nitride. Thus, in order to perform etching so that the selectivity of the silicon nitride is high in the structure in which silicon nitride and silicon oxide are laminated, a method including performing dry etching without generating plasma using treatment gas containing hydrogen fluoride gas and fluorine gas is applicable, for example. This method is described in JP-A-2010-182730, for example. Moreover, as described in JP-A-9-45660, a wet etching method employing an etching liquid in which water, hydrogen fluoride, and the like are added to a heated phosphorylated solution is also usable.

Next, the optical structure in the electrooptical device 1 of this embodiment is described. The electrooptical device 1 in this embodiment employs a resonance structure in which a standing wave is generated in the second electrode E2 from the reflective layer 43 by setting the optical distance from the reflective layer 43 to the second electrode E2 as a transflective layer to a predetermined value.

Specifically, the structure satisfies the following expression when the optical distance from the reflective layer 43 to the second electrode E2 is set to D, the phase shift in the reflection on the reflective layer 43 is set to $\varphi_L$, the phase shift in the reflection on the second electrode E2 is set to $\varphi_U$, the peak wavelength of the standing wave is set to $\lambda$, and an integer is set to m.

$$D = \{(2\pi m + \varphi_L + \varphi_U)/4\varphi\}\lambda \qquad (1)$$

In this embodiment, m=1 is set in Expression (1) above and the resonance wavelength of each color of red, green, and blue is set to 610 nm, 535 nm, and 470 nm, respectively.

Figure 5B:
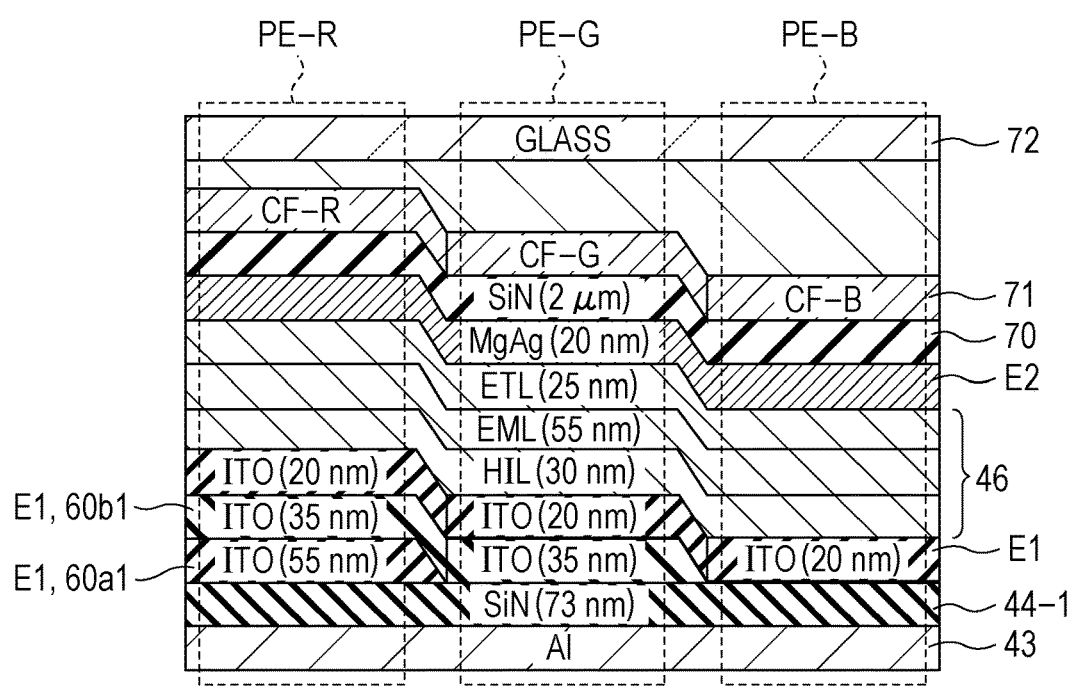
FIG. 5B is a view schematically illustrating a material used for each layer of the electrooptical device of Comparative Example 1 and the layer thickness of each layer.

Next, Examples and Comparative Examples of the present invention are described with reference to FIG. 5A to FIG. 14. FIG. 5B, FIG. 6, and FIG. 7B to FIG. 10 are views schematically illustrating a material used for each layer from the reflective layer 43 to a sealing layer 70 and the layer thickness of each layer in Comparative Examples and Examples. FIG. 5B, FIG. 6, and FIG. 7B to FIG. 10 illustrate a sealing layer 70, a color filter 71, and a counter glass 72 which are not illustrated in FIG. 4. The color filter 71 contains a red color filter CF-R, a green color filter CF-G, and a blue color filter CF-B. FIG. 5A is a cross-sectional view of an electrooptical device according to Comparative Example 1. FIG. 7A is a cross-sectional view of an electrooptical device according to Example 1.

In FIG. 5B, FIG. 6, and FIG. 7B to FIG. 10, the light emitting function layer 46 contains a hole injection layer (HIL), a light emitting layer (EML), and an electron transporting layer (ETL) and the layer thickness of the layers are set to 30 nm, 55 nm, and 25 nm, respectively. The configuration of the light emitting function layer 46 and the layer thickness of each layer configuring the light emitting function layer 46 are common in Examples and Comparative Examples.

In FIG. 5B, FIG. 6, and FIG. 7B to FIG. 10, the sealing layer 70 is formed of silicon oxynitride and the layer thickness is set to 2 µm. The material forming the sealing layer 70 and the layer thickness thereof are common in Examples and Comparative Examples.

In FIG. 5B, FIG. 6, and FIG. 7B to FIG. 10, the reflective layer 43 is formed of aluminum and the film thickness is set to 100 nm, for example. The material forming the reflective layer 43 and the layer thickness are common in Examples and Comparative Examples.

Comparative Example 1

FIG. 5A is a cross-sectional view of an electrooptical device of Comparative Example 1. FIG. 5B is a view schematically illustrating a material used for each layer of the electrooptical device and the layer thickness of each layer of Comparative Example 1.

As illustrated in FIG. 5A, in the electrooptical device according to Comparative Example 1, the reflective layer 43 is provided on the surface of the insulating layer LD and a protective layer 44-1 is provided on the surface of the reflective layer 43. In the electrooptical device according to Comparative Example 1, a first optical path length adjusting layer 60a1 is provided on the surface of the protective layer 44-1, a second optical path length adjusting layer 60b1 is provided on the surface of the first optical path length adjusting layer 60a1, and a first electrode E1 is provided on the surface of the second optical path length adjusting layer 60b1 in the subpixel PE-R. In the electrooptical device according to Comparative Example 1, a second optical path length adjusting layer 60b1 is provided on the surface of the protective layer 44-1 and the first electrode E1 is provided on the surface of the second optical path length adjusting layer 60b1 in the subpixel PE-G. In the electrooptical device according to Comparative Example 1, the first electrode E1 is provided on the surface of the protective layer 44-1 in the subpixel PE-B. In the electrooptical device according to Comparative Example 1, a pixel definition layer 65 is provided so as to cover the protective layer 44-1, the first optical path length adjusting layer 60a1, and the second optical path length adjusting layer 60b1 and partition the plurality of first electrodes E1 from each other, the light emitting function layer 46 is provided so as to cover the pixel definition layer 65 and the first electrode E1, and the second electrode E2 is provided on the surface of the light emitting function layer 46. As illustrated in FIG. 5A, the first optical path length adjusting layer 60a1, the second optical path length adjusting layer 60b1, and the first electrode E1 are separated as to be independently controllable among the subpixels PE-R, PE-G, and PE-B. Therefore, a level difference is formed by the first optical path length adjusting layer 60a1, the second optical path length adjusting layer 60b1, and the first electrode E1 among the subpixels PE-R, PE-G, and PE-B.

In Comparative Example 1, the protective layer 44-1 was formed of silicon nitride (SiN) and the layer thickness was set to 73 nm as illustrated in FIG. 5B. Comparative Example 1 has a structure in which indium tin oxide (ITO) is used for a first electrode E1, a first optical path length adjusting layer 60a1, and a second optical path length adjusting layer 60b1. More specifically, in Comparative Example 1, the first optical path length adjusting layer 60a1 and the second optical path length adjusting layer 60b1 also function as the first electrode E1 and the first optical path length adjusting layer 60a1 and the second optical path length adjusting layer 60b1 are formed of conductive films. In the subpixel PE-R, the layer thickness of the indium tin oxide (ITO) forming the first optical path length adjusting layer 60a1 was set to 55 nm. In the subpixel PE-R and the subpixel PE-G, the layer thickness of the indium tin oxide (ITO) forming the second optical path length adjusting layer 60b1 was set to 35 nm. The layer thickness of the indium tin oxide (ITO) forming the first electrode E1 which is formed in a lower layer of the hole injection layer (HIL) was set to 20 nm in the subpixel of each color.

The refractive index of the silicon nitride (SiN) is about 1.8 to 2.0. The refractive index of the indium tin oxide (ITO) is about 1.8. Accordingly, in Comparative Example 1, the protective layer 44-1, the first electrode E1, the first optical path length adjusting layer 60a1, and the second optical path length adjusting layer 60b1 are formed of materials whose refractive indices are close to each other, and therefore there is no refractive index interface from the protective layer 44-1 to the first electrode E1 and luminosity reduction is not caused in Comparative Example 1. The optical distance is obtained by the product of the refractive index and the layer thickness. When indium tin oxide (ITO) was used as the first optical path length adjusting layer 60a1 and the second optical path length adjusting layer 60b1, the layer thickness can be made smaller than that in the case of using silicon oxide ($SiO_2$) having a refractive index lower than the refractive index of the indium tin oxide (ITO). As a result, the level difference between the subpixels can be reduced. However, the indium tin oxide (ITO) is a conductive material, and therefore it is necessary to insulate not only the space between the subpixels of different colors in the X direction illustrated but the subpixels of the same color in the Y direction in FIG. 3, so that the opening ratio tends to decrease.

Comparative Example 2

Figure 6:
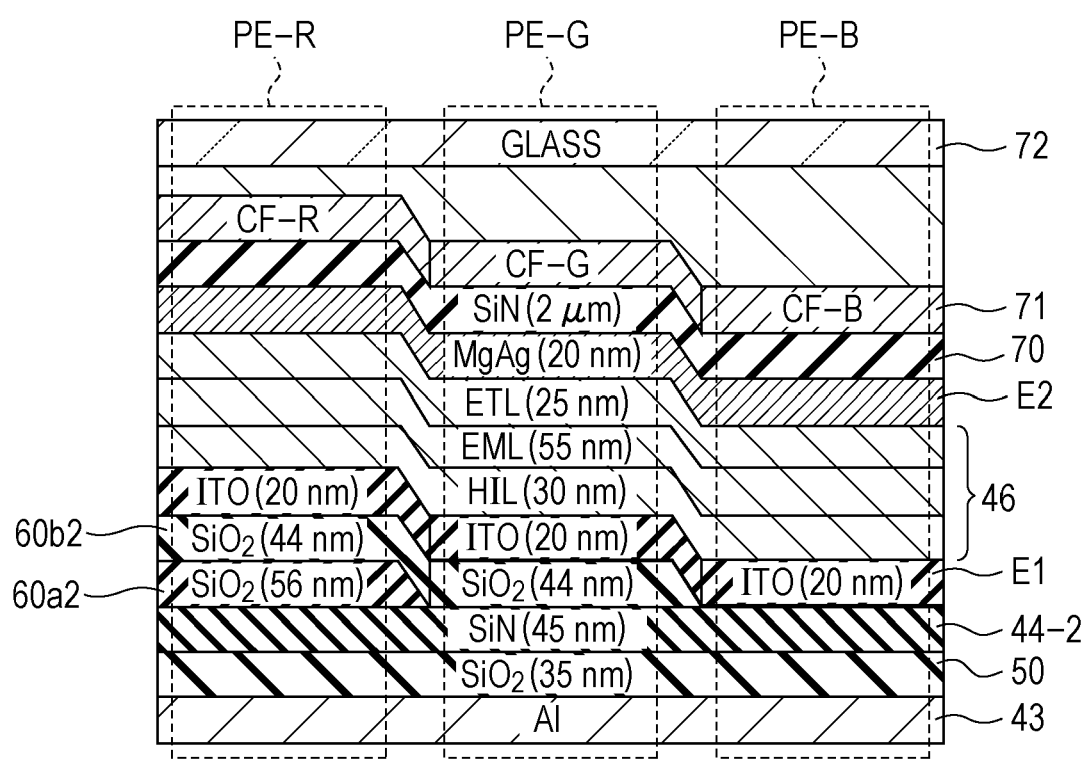
FIG. 6 is a view schematically illustrating a material used for each layer of an electrooptical device of Comparative Example 2 and the layer thickness of each layer.
Figure 7B:
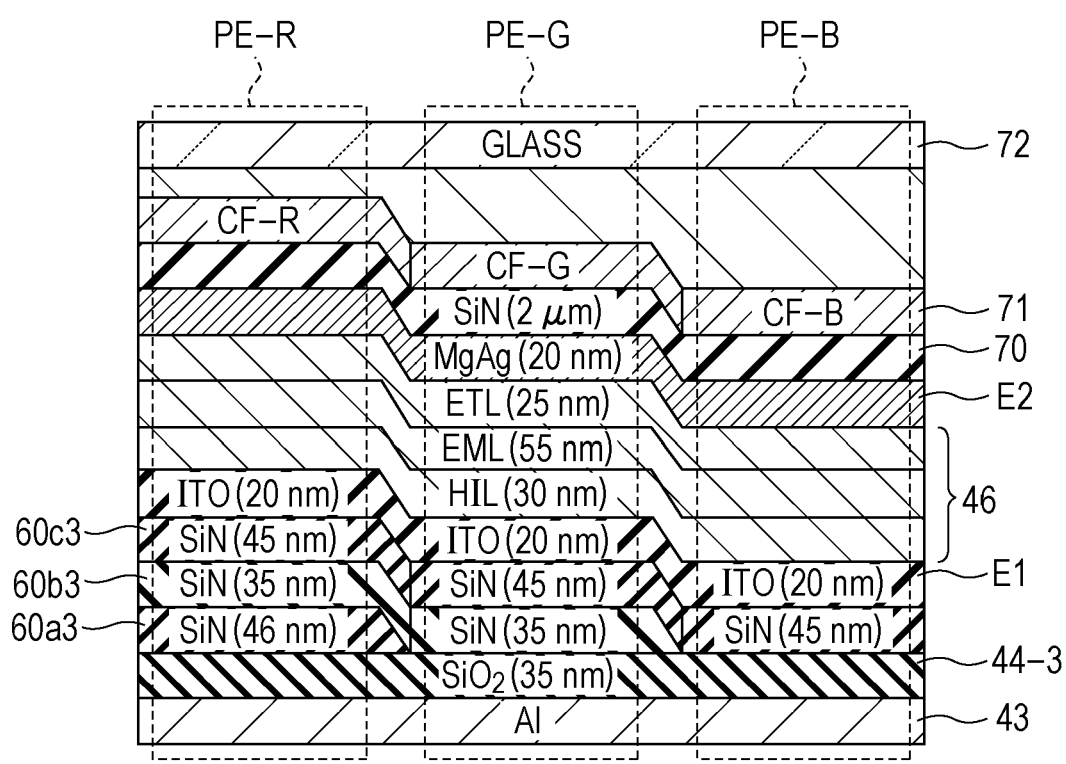
FIG. 7B is a view schematically illustrating a material used for each layer of the electrooptical device of Example 1 and the layer thickness of each layer.

FIG. 6 is a view schematically illustrating a material used for each layer of the electrooptical device of Comparative Example 2 and the layer thickness of each layer. Comparative Example 2 is the same as Comparative Example 1 in that a protective layer 44-2 was formed of silicon nitride (SiN) but the layer thickness was set to 45 nm as illustrated in FIG. 6. Comparative Example 2 is also the same as Comparative Example 1 in that indium tin oxide (ITO) was used as the first electrode E1 to be formed in a lower layer of the hole injection layer (HIL) and the layer thickness was set to 20 nm as with Comparative Example 1. However, Comparative Example 2 is different from Comparative Example 1 in that silicon oxide ($SiO_2$) having a refractive index lower than the refractive index of indium tin oxide (ITO) was used as the first optical path length adjusting layer 60a2 and the second optical path length adjusting layer 60b2. The layer thickness of the silicon oxide ($SiO_2$) functioning as the first optical path length adjusting layer 60a2 was set to 56 nm. The layer thickness of the silicon oxide ($SiO_2$) functioning as the second optical path length adjusting layer 60b2 was set to 44 nm.

The refractive index of the silicon oxide ($SiO_2$) is about 1.45 to 1.46 and is lower than the refractive index of the indium tin oxide (ITO). As a result, in Comparative Example 2, a refractive index interface is present between the indium tin oxide (ITO) as the first electrode E1 and the silicon oxide ($SiO_2$) as the second optical path length adjusting layer 60b2 and between the silicon oxide ($SiO_2$) as the first optical path length adjusting layer 60a2 and the silicon nitride (SiN) as the protective layer 44-2, so that the luminosity decreases. Then, in Comparative Example 2, a reflection enhancing layer 50 is formed of silicon oxide ($SiO_2$) between the protective layer 44-2 and the reflective layer 43 to improve the luminosity. The layer thickness of the reflection enhancing layer was set to 35 nm. In Comparative Example 2, silicon oxide ($SiO_2$) having a refractive index lower than the refractive index of the indium tin oxide (ITO) is used as the first optical path length adjusting layer 60a2 and the second optical path length adjusting layer 60b2, and therefore the layer thickness of each of the first optical path length adjusting layer 60a2 and the second optical path length adjusting layer 60b2 is larger than that in Comparative Example 1. Therefore, the level difference between the subpixels becomes larger than that in Comparative Example 1.

Example 1

FIG. 7A is a cross-sectional view of an electrooptical device 1 of Example 1. FIG. 7B is a view schematically illustrating a material used for each layer of the electrooptical device 1 of Example 1 and the layer thickness of each layer.

As illustrated in FIG. 7A, the electrooptical device 1 according to Example 1 is different from the electrooptical device 1 of the embodiment illustrated in FIG. 4 in that a third optical path length adjusting layer 60c was formed. In Example 1, a first optical path length adjusting layer 60a3, a second optical path length adjusting layer 60b3, and the third optical path length adjusting layer 60c3 are laminated on an protective layer 44-3 in the subpixel PE-R and optical path adjustment is performed by the first optical path length adjusting layer 60a3, the second optical path length adjusting layer 60b3, and the third optical path length adjusting layer 60c3. In the subpixel PE-G, the second optical path length adjusting layer 60b3 and the third optical path length adjusting layer 60c3 are laminated on the protective layer 44-3 and optical path adjustment is performed by the second optical path length adjusting layer 60b3 and the third optical path length adjusting layer 60c3. In the subpixel PE-B, the third optical path length adjusting layer 60c3 is formed on the protective layer 44-3 and optical path adjustment is performed by the third optical path length adjusting layer 60c3. As illustrated in FIG. 7B, the first optical path length adjusting layer 60a3, the second optical path length adjusting layer 60b3, and the third optical path length adjusting layer 60c3 were all formed of silicon nitride (SiN) and the layer thickness of each layer was set to 46 nm, 35 nm, and 45 nm, respectively. In Example 1, the "optical path length adjusting layer" in Claims is a general term for the first optical path length adjusting layer 60a3, the second optical path length adjusting layer 60b3, and the third optical path length adjusting layer 60c3. In Example 1, silicon oxide ($SiO_2$) was used as the protective layer 44-3 and the layer thickness was set to 35 nm. In Example 1, the protective layer 44-3 is in contact with the reflective layer 43 and also functions as a reflection enhancing layer.

As described above, the refractive index of the silicon oxide ($SiO_2$) is about 1.45, the refractive index of the silicon nitride (SiN) is 1.8 to about 2.0, and the refractive index of the indium tin oxide (ITO) is about 1.8. In Example 1, silicon nitride (SiN) having a refractive index close to the refractive index of indium tin oxide (ITO) is used as the first optical path length adjusting layer 60a3, the second optical path length adjusting layer 60b3, and the third optical path length adjusting layer 60c3. More specifically, in Example 1, a difference between the refractive index of the optical path length adjusting layer and the refractive index of the first electrode E1 is smaller than a difference between the refractive index of the protective layer 44 and the refractive index of the first electrode E1. Therefore, the refractive index interface is present only between the silicon oxide ($SiO_2$) as the protective layer 44-3 and the silicon nitride (SiN) as the first optical path length adjusting layer 60a3, the second optical path length adjusting layer 60b3, or the third optical path length adjusting layer 60c3.

Example 2

Figure 8:
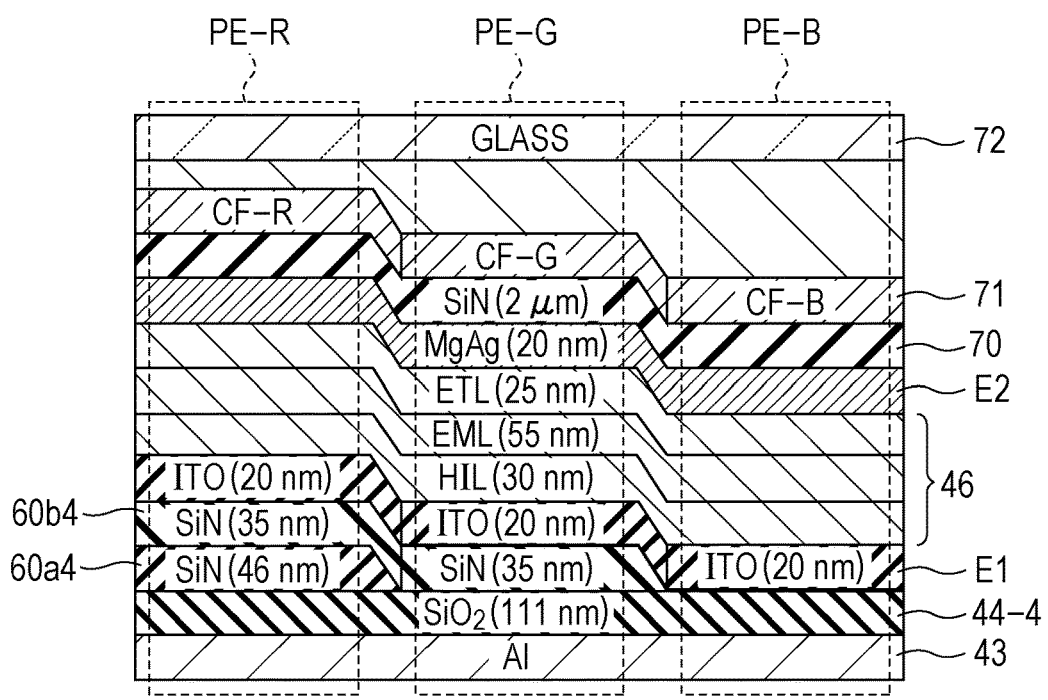
FIG. 8 is a view schematically illustrating a material used for each layer of an electrooptical device of Example 2 and the layer thickness of each layer and is a cross sectional view in the column direction of the pixels in the display area.

FIG. 8 is a view schematically illustrating a material used for each layer of the electrooptical device 1 of Example 2 and the layer thickness of each layer. Example 2 is the same as Example 1 in that silicon oxide ($SiO_2$) was used as a protective layer 44-4. Also in Example 2, the protective layer 44-4 is in contact with the reflective layer 43 and also functions as a reflection enhancing layer. However, the protective layer 44-4 is different from that of Example 1 in that the layer thickness was set to 111 nm. When the layer thickness of the silicon oxide ($SiO_2$) as the protective layer 44-4 is small, there is a risk in terms of a process. Therefore, in order to avoid the risk, the layer thickness is made thick in Example 2. Moreover, Example 2 is different from Example 1 in that, in order to increase the layer thickness of the silicon oxide ($SiO_2$) as the protective layer 44-4, no optical path length adjusting layer is provided in the subpixel PE-B. More specifically, the optical path length adjusting layer is configured from the first optical path length adjusting layer 60a4 and the second optical path length adjusting layer 60b4 in Example 2 as with the electrooptical device 1 of the embodiment illustrated in FIG. 4. In Example 2, the "optical path length adjusting layer" in Claims is a general term for the first optical path length adjusting layer 60a4 and the second optical path length adjusting layer 60b4.

In Example 2, in the subpixel PE-R, the first optical path length adjusting layer 60a4 and the second optical path length adjusting layer 60b4 are laminated on the protective layer 44-4 and optical path adjustment is performed by the first optical path length adjusting layer 60a4 and the second optical path length adjusting layer 60*b*4. In the subpixel PE-G, the second optical path length adjusting layer 60*b*4 is formed on the protective layer 44-4 and optical path adjustment is performed by the second optical path length adjusting layer 60*b*4. In the subpixel PE-B, no optical path length adjusting layer is formed on the protective layer 44-4. The first optical path length adjusting layer 60*a*4 and the second optical path length adjusting layer 60*b*4 were formed of silicon nitride (SiN) and the layer thickness of each layer was set to 46 nm and 35 nm, respectively, as with Example 1.

Also in Example 2, silicon nitride (SiN) having a refractive index close to the refractive index of indium tin oxide (ITO) is used for the first optical path length adjusting layer 60*a*4 and the second optical path length adjusting layer 60*b*4, and therefore a difference between the refractive index of the optical path length adjusting layer and the refractive index of the first electrode E1 is smaller than a difference between the refractive index of the protective layer 44 and the refractive index of the first electrode E1. Thus, a refractive index interface is present only between silicon oxide ($SiO_2$) as the protective layer 44-4 and the silicon nitride (SiN) as the first optical path length adjusting layer 60*a*4.

In Example 2, silicon nitride (SiN) having a refractive index higher than the refractive index of silicon oxide ($SiO_2$) is used as the first optical path length adjusting layer 60*a*4 and the second optical path length adjusting layer 60*b*4, and therefore the layer thickness of each layer can be reduced by about 10 nm as compared with Comparative Example 2. As a result, the level difference between the pixels can be reduced.

Example 3

Figure 9:
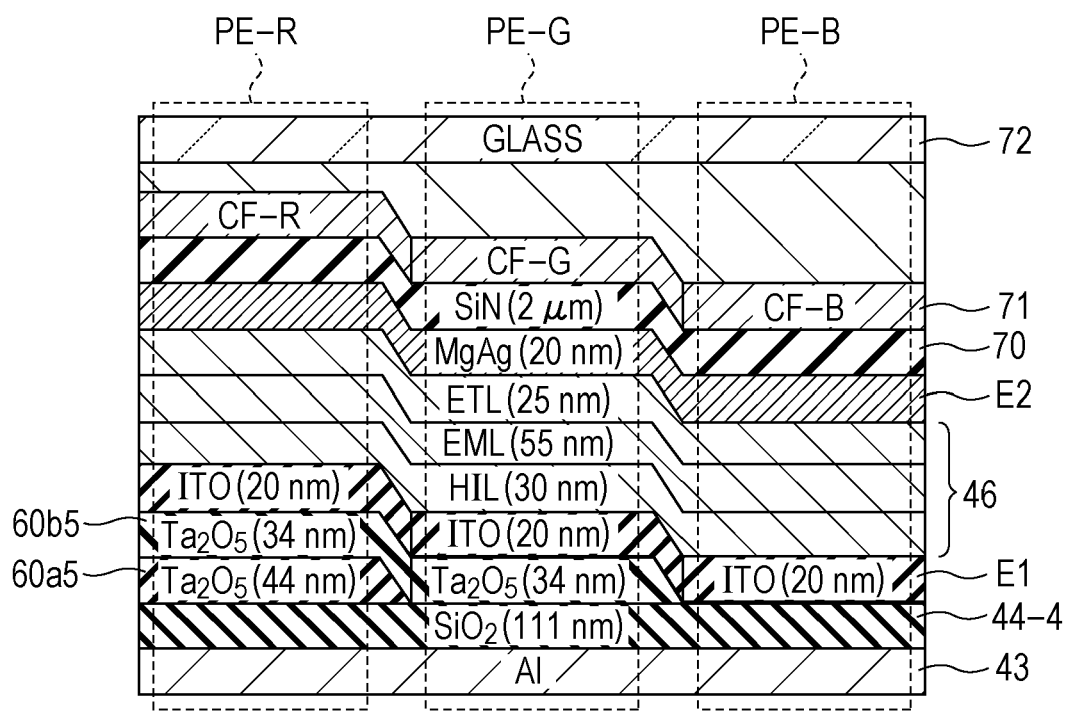
FIG. 9 is a view schematically illustrating a material used for each layer of an electrooptical device of Example 3 and the layer thickness of each layer and is a cross sectional view in the column direction of the pixels in the display area.

FIG. 9 is a view schematically illustrating a material used for each layer of an electrooptical device 1 of Example 3 and the layer thickness of each layer. Example 3 is different from Example 2 in that the first optical path length adjusting layer 60*a*5 and the second optical path length adjusting layer 60*b*5 were formed of tantalum oxide ($Ta_2O_5$). In Example 3, the "optical path length adjusting layer" in Claims is a general term for a first optical path length adjusting layer 60*a*5 and a second optical path length adjusting layer 60*b*5.

In Example 3, in the subpixel PE-R, the first optical path length adjusting layer 60*a*5 and the second optical path length adjusting layer 60*b*5 are laminated on the protective layer 44-4 and optical path adjustment is performed by the first optical path length adjusting layer 60*a*5 and the second optical path length adjusting layer 60*b*5. In the subpixel PE-G, the second optical path length adjusting layer 60*b*5 is formed on the protective layer 44-4 and optical path adjustment is performed by the second optical path length adjusting layer 60*b*5. The layer thickness of each of the first optical path length adjusting layer 60*a*5 and the second optical path length adjusting layer 60*b*5 was set to 44 nm and 34 nm, respectively.

Also in Example 3, no optical path length adjusting layer is provided in the subpixel PE-B. The refractive index of the tantalum oxide ($Ta_2O_5$) is also close to the refractive index of the indium tin oxide (ITO), and therefore a refractive index interface is present only between silicon oxide ($SiO_2$) as the protective layer 44 and the tantalum oxide ($Ta_2O_5$) as the first optical path length adjusting layer 60*a*5. In Example 3, the tantalum oxide ($Ta_2O_5$) having a refractive index higher than the refractive index of the silicon oxide ($SiO_2$) is used as the first optical path length adjusting layer 60*a*5 and the second optical path length adjusting layer 60*b*5, and therefore the layer thickness of each layer can be reduced by about 10 nm as compared with Comparative Example 2. As a result, a level difference between the pixels can be reduced. Also in Example 3, the protective layer 44-4 is in contact with the reflective layer 43 and also functions as a reflection enhancing layer.

Example 4

Figure 10:
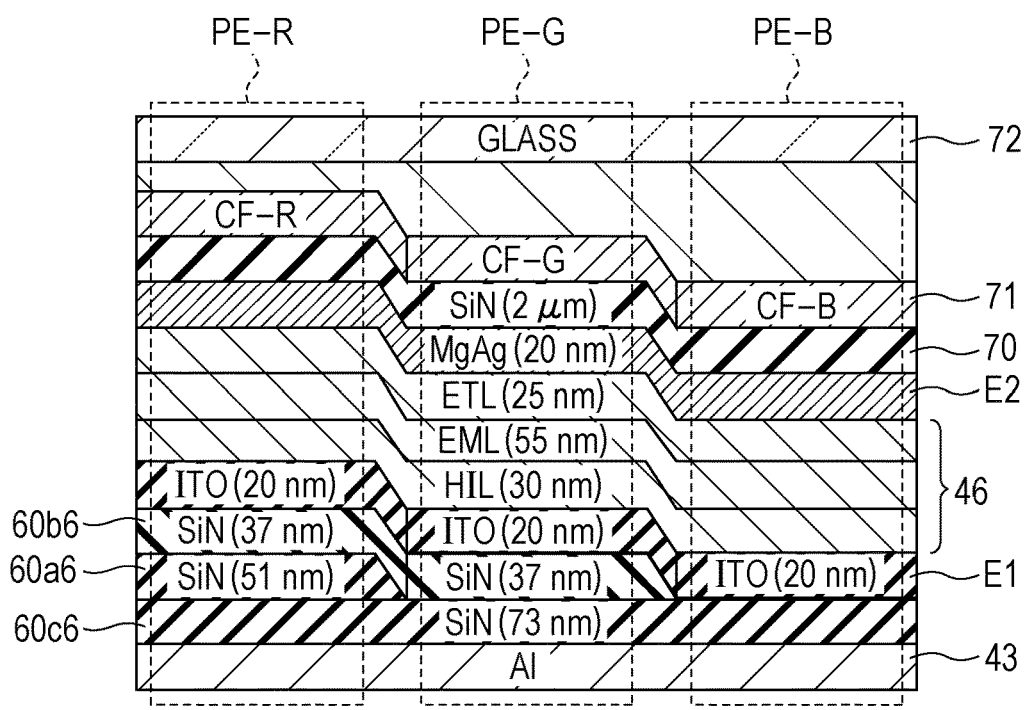
FIG. 10 is a view schematically illustrating a material used for each layer of an electrooptical device of Example 4 and the layer thickness of each layer and is a cross sectional view in the column direction of the pixels in the display area.

FIG. 10 is a view schematically illustrating a material used for each layer of an electrooptical device 1 of Example 4 and the layer thickness of each layer. Example 4 is different from Example 2 in that a third optical path length adjusting layer 60*c*4 common in each pixel was provided as the protective layer 44-4. The third optical path length adjusting layer 60*c*4 was formed of silicon nitride (SiN) and the layer thickness was set to 73 nm. A first optical path length adjusting layer 60*a*6 and a second optical path length adjusting layer 60*b*6 were formed of silicon nitride (SiN) as with Example 2, and the layer thickness of each of the first optical path length adjusting layer 60*a*5 and the second optical path length adjusting layer 60*b*6 was set to 51 nm and 37 nm, respectively.

In Example 4, the "optical path length adjusting layer" in Claims is a general term for the first optical path length adjusting layer 60*a*6, the second optical path length adjusting layer 60*b*6, and the third optical path length adjusting layer 60*c*4. In Example 4, the third optical path length adjusting layer 60*c*4 functions also as a "protective layer".

In Example 4, in the subpixel PE-R, the third optical path length adjusting layer 60*c*4, the first optical path length adjusting layer 60*a*6, and the second optical path length adjusting layer 60*b*6 are laminated on the reflective layer 43 and optical path adjustment is performed by the third optical path length adjusting layer 60*c*4, the first optical path length adjusting layer 60*a*6, and the second optical path length adjusting layer 60*b*6. In the subpixel PE-G, the third optical path length adjusting layer 60*c*4 and the second optical path length adjusting layer 60*b*6 are formed on the reflective layer 43 and optical path adjustment is performed by the third optical path length adjusting layer 60*c*4 and the second optical path length adjusting layer 60*b*6. In the subpixel PE-B, the third optical path length adjusting layer 60*c*4 is formed on the reflective layer 43 and optical path adjustment is performed by the third optical path length adjusting layer 60*c*4.

In Example 4, the protective layer 44 containing silicon oxide ($SiO_2$) is not provided, and therefore no refractive index interface is present. In Example 4, the refractive indices of the first optical path length adjusting layer 60*a*6, the second optical path length adjusting layer 60*b*6, and the third optical path length adjusting layer 60*c*4 are equal to or higher than the refractive index of the first electrode E1.

In this Example, the third optical path length adjusting layer 60*c*4 common in each subpixel is formed on the reflective layer 43 but the third optical path length adjusting layer 60*c*4 common in each subpixel may be formed on the first optical path length adjusting layer 60*a*6 and the second optical path length adjusting layer 60*b*6 as a modification.

Comparison of Optical Characteristics

Figure 11:
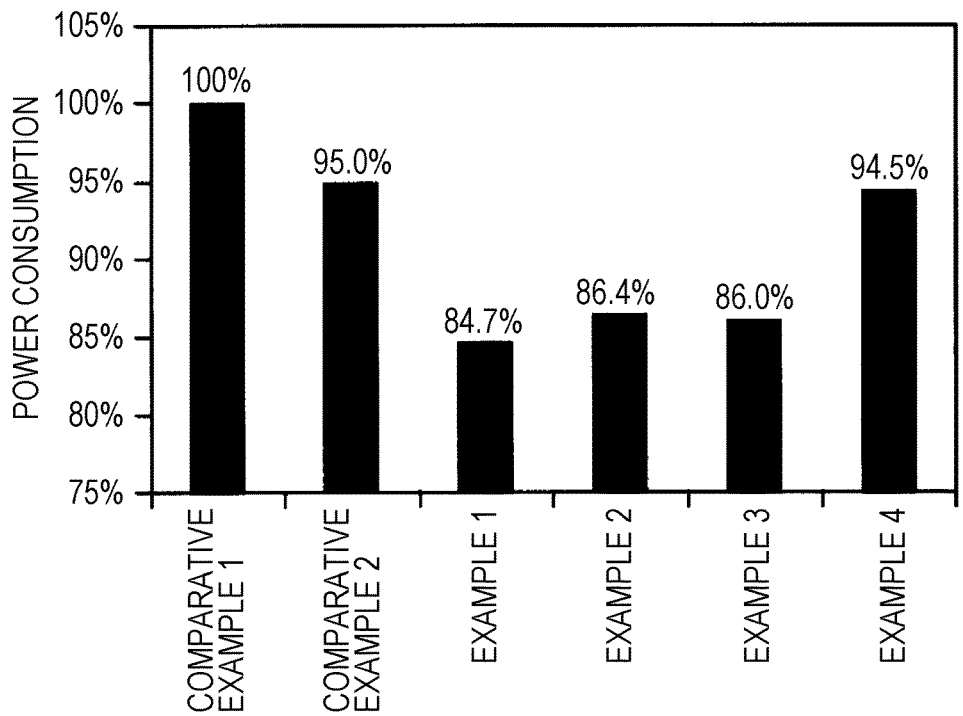
FIG. 11 is a view illustrating the power consumption in performing white display in the electrooptical device of each Example and each Comparative Example.

Next, a comparison of the optical characteristics of each Example and each Comparative Example is described with reference to FIG. 11 to FIG. 14. FIG. 11 is a view illustrating the power consumption in performing white display with the same luminosity in the electrooptical device of each Example and each Comparative Example. FIG. 11 illustrates the power consumption standardized with Comparative Example 1. As is understood from FIG. 11, about 15% of power consumption reduction is achieved in Example 1 to Example 3 as compared with Comparative Example 1 and Comparative Example 2. In Comparative Example 1, a layer functioning as a reflection enhancing layer is not present but, in all Example 1 to Example 3, the protective layer 44 function as the reflection enhancing layer. Therefore, it is considered that the luminosity of Example 1 to Example 3 increases as compared with Comparative Example 1, and thus the power consumption reduction is achieved. In Comparative Example 2, the reflection enhancing layer 50 is present but it is considered that the refractive index interface increased as compared with Example 1 to Example 3, so that the luminosity decreased as described above. In Example 4, it is considered that the third optical path length adjusting layer 60c4 is formed of silicon nitride (SiN) and the protective layer 44 functioning as the reflection enhancing layer is not provided, and therefore the luminosity decreased as compared with Example 1 to Example 3.

In Comparative Example 1, the reflective layer 43 was formed containing aluminum and the protective layer 44-1 was formed of silicon nitride (SiN) having a refractive index of 1.8 thereon, and therefore the reflectance at a wavelength of 550 nm is 86.8% and there is absorption on the reflection plane of the reflective layer 43. On the other hand, in Example 1, the protective layer 44-3 is formed as silicon oxide ($SiO_2$) having a refractive index of 1.45, and therefore the reflectance at a wavelength of 550 nm is 89.0%. In Comparative Example 2, there is a refractive index interface is present on the interface between the reflection enhancing layer 50 and the protective layer 44-2, the interface between the first optical path length adjusting layer 60a2 or the second optical path length adjusting layer 60b2 and the protective layer 44-2, and the interface between the second optical path length adjusting layer 60b2 and the first electrode E1. Therefore, there are three refractive index interfaces. On the other hand, in Example 1, the number of refractive index interfaces is one. Specifically, there is a refractive index interface only between any one of the first optical path length adjusting layer 60a3, the second optical path length adjusting layer 60b3, and the third optical path length adjusting layer 60c3 and the protective layer 44-3. It is considered that, due to the above-described configuration, the power consumption of Example 1 decreased to 84.7%.

Also in Example 2, the reflectance on the reflection plane of the reflective layer is 89.0% as with Example 1. The number of refractive index interfaces is one also in Example 2. Specifically, the refractive index interface is present only between the first optical path length adjusting layer 60a4, the second optical path length adjusting layer 60b4, or the first electrode E1 and the protective layer 44-4. It is considered that, due to the above-described configuration, the power consumption of Example 1 decreased to 86.4%. It is considered that the power consumption decreased to 86.0% also in Example 3 as with Example 2.

In Example 4, the reflective layer 43 was formed containing aluminum and, on the reflective layer 43, the third optical path length adjusting layer 60c4 formed of silicon nitride (SiN) having a refractive index of 1.8 was formed in place of the protective layer 44-4 formed of silicon oxide ($SiO_2$), and therefore the reflectance at a wavelength of 550 nm is 86.8%. Moreover, in Example 4, the first optical path length adjusting layer 60a6, the second optical path length adjusting layer 60b6, and the third optical path length adjusting layer 60c4 as the optical path length adjusting layer were formed of silicon nitride (SiN) having a refractive index of 1.8 between the first electrode E1 and the reflective layer 43, and therefore no refractive index interface is present. Therefore, it is considered that the power consumption of Example 4 decreased to 94.5%.

Figure 12:
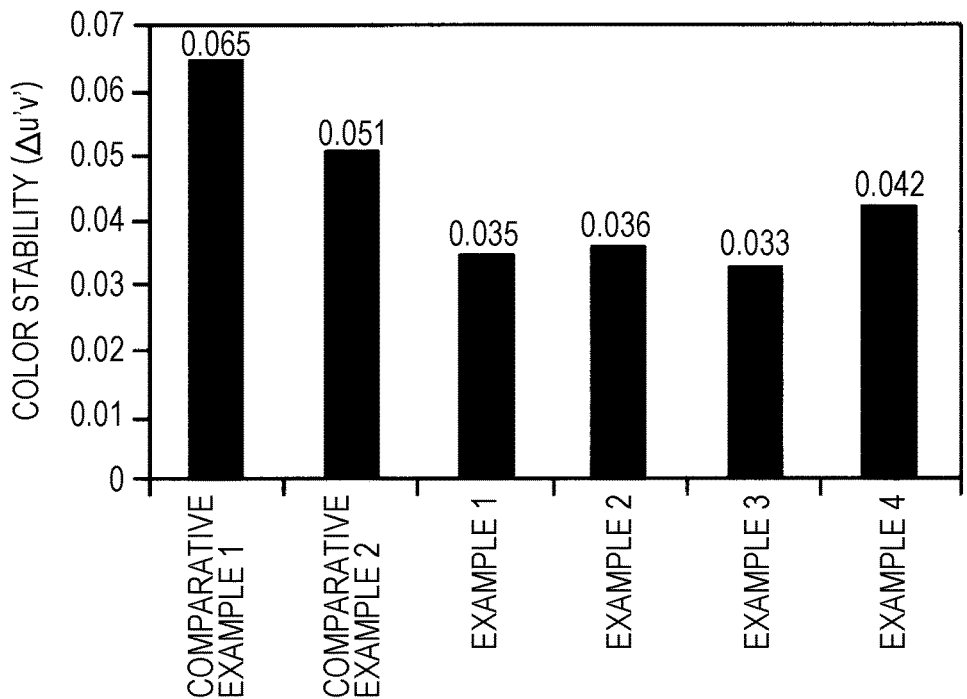
FIG. 12 is a view illustrating the color stability in the electrooptical device of each Example and each Comparative Example.

FIG. 12 is a view illustrating the color stability in the electrooptical device of each Example and each Comparative Example. The color stability is calculated from a chromaticity difference between white display (256 gradations) and low luminosity (20 gradations). FIG. 13 is a view illustrating the level difference between the pixels in the electrooptical device of each Example and each Comparative Example.

As is understood from FIG. 13, the level difference between the pixels is smaller in Example 1 to Example 4 than that in Comparative Example 1 and Comparative Example 2. This is considered to be because the optical path length adjusting layer is formed of silicon nitride (SiN) having a refractive index higher than the refractive index of silicon oxide ($SiO_2$) and equal to or higher than the refractive index of indium tin oxide (ITO) in Example 1 to Example 4. When the level difference between the pixels increases, a thin portion is locally generated in the light emitting function layer 46. Therefore, an excessive current flows to the outside of the pixels particularly at a low luminosity, so that the color stability decreases. However, Example 1 to Example 4 have a level difference between the pixels smaller than that in Comparative Example 1 and Comparative Example 2. Therefore, as is understood from FIG. 12, the color stability is better than that in Comparative Example 1 and Comparative Example 2.

FIG. 14 is a view illustrating the evaluation result of the reliability in the electrooptical device of each Example and each Comparative Example. The evaluation result of the reliability of FIG. 14 shows the time until abnormalities in reliability referred to as a dark spot occurred after each electrooptical device was allowed to stand in a high temperature and high humidity environment of a temperature of 85° C. and a humidity of 85%. In the experiment, the electrooptical device was taken out every 100 h (time), and was confirmed whether light was emitted.

It is considered that the dark spot is generated due to the fact that cracks are generated in the sealing layer 70, so that water enters the electrooptical device. As is understood from FIG. 14, the time until the abnormalities in reliability occurred is longer in all Example 1 to Example 3 than that in Comparative Example 1 and Comparative Example 2. This is considered to be because the level difference between the pixels is smaller in all Example 1 to Example 3 than that in Comparative Example 1 and Comparative Example 2, and therefore cracks are difficult to be formed in the sealing layer 70. In Example 4, the level difference between the pixels is larger than that in Example 1 to Example 3 because the three optical path length adjusting layers are provided. However, silicon nitride (SiN) is used for the optical path length adjusting layer, and therefore the level difference between the pixels is smaller than that in Comparative Example 2 in which silicon oxide ($SiO_2$) is used as the optical path length adjusting layer. As a result, the time until the abnormalities in reliability occurred is longer in Example 4 than that in Comparative Example 2.

As described above, according to this embodiment, the optical path length adjusting layer is formed of a material having a refractive index higher than the refractive index of the protective layer, and therefore the refractive index interface in the resonance structure can be reduced and the power consumption reduction can be achieved. Moreover, in this embodiment, the optical path length adjusting layer is formed of a material having a refractive index higher than the refractive index of the protective layer, and therefore the level difference between the pixels can be reduced and the color stability and the reliability can be increased. Moreover, in this embodiment, the optical path length adjusting layer is an insulating layer and is formed of a material having a refractive index equal to or higher than the refractive index of the first electrode, and therefore the level difference between the pixels can be reduced and the color stability and the reliability can be increased.

Modification

The present invention is not limited to each embodiment described above and can be variously modified as described below, for example. It is a matter of course that each embodiment and each modification may be combined as appropriate.

(1) The embodiments described above describe the examples in which the optical path length adjusting layer is formed of silicon nitride (SiN) or tantalum oxide ($Ta_2O_5$). However, the present invention is not limited to such a configuration and the optical path length adjusting layer may contain materials having a refractive index higher than the refractive index of the protective layer or materials equal to or higher than the refractive index of the first electrode may be acceptable. For example, any material of titanium oxide (TiOx), tantalum oxide (TaOx), aluminum oxide (AlOx), molybdenum oxide (MoOx), tungsten oxide (WOx), and hafnium oxide (HfOx) is usable as the optical path length adjusting layer. When these materials are used as the optical path length adjusting layer, an etching method may be selected in such a manner that the selectivity of these materials may be higher than the selectively of the silicon oxide ($SiO_2$) used as the protective layer.

(2) The embodiments described above describe the electrooptical device 1 of the top emission structure but the present invention is also applicable to an electrooptical device of a bottom emission structure. In the case of the bottom emission structure, a reflective layer, an optical path length adjusting layer, a first electrode, a light emitting function layer, and a second electrode are disposed toward a lower layer from an upper layer.

(3) The embodiments described above describe the electrooptical device 1 in which the light emitting function layer emitting white light and the resonance structure are combined but the present invention is also applicable to a so-called electrooptical device of an RGB separate coating type in which the light emitting function layer is separately coated with the respective colors. In this case, by adjusting the optical path length by the optical path length adjusting layer of the present invention, the layer thickness of the light emitting function layer can be reduced, which is an advantageous in terms of a process and the cost.

(4) The embodiments described above describe the electrooptical device 1 in which the area ratio of the subpixel of each color is equal but the present invention is also applicable to an electrooptical device in which the area of a subpixel of a color with a short life is larger than the area of subpixels of the other colors.

Application Examples

Figure 15:
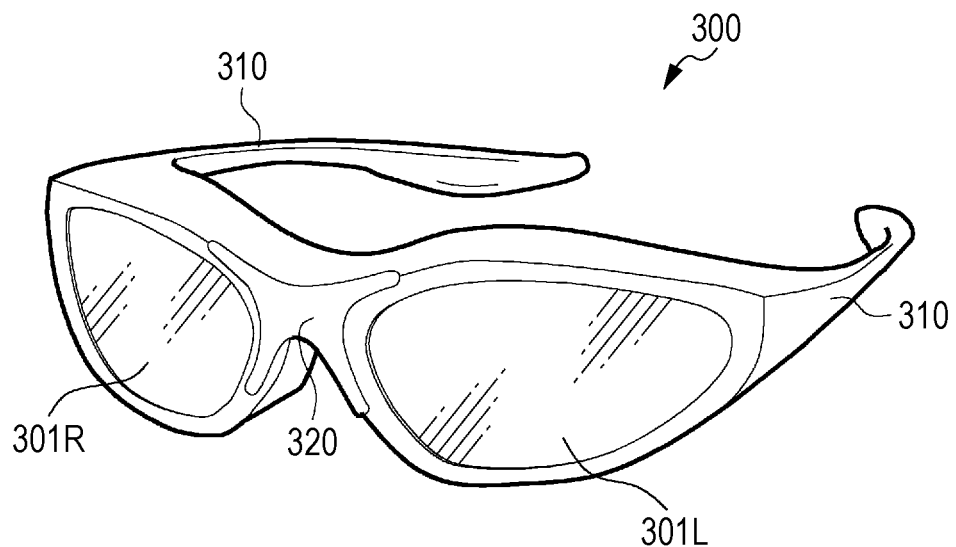
FIG. 15 is a diagram illustrating an example of an electronic instrument.
Figure 16:
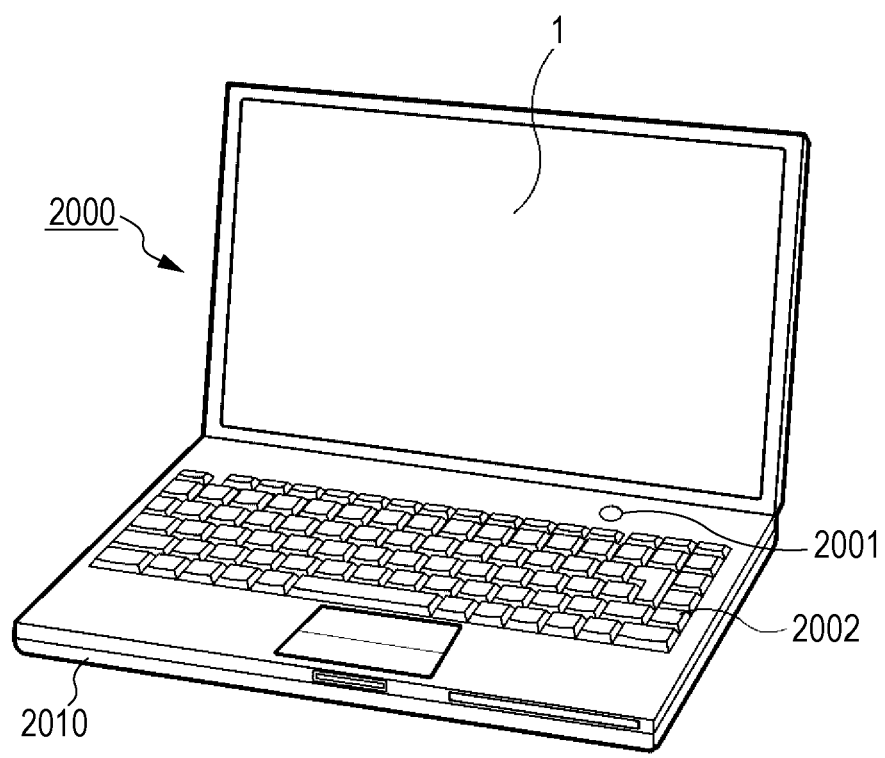
FIG. 16 is a diagram illustrating another example of an electronic instrument.
Figure 17:
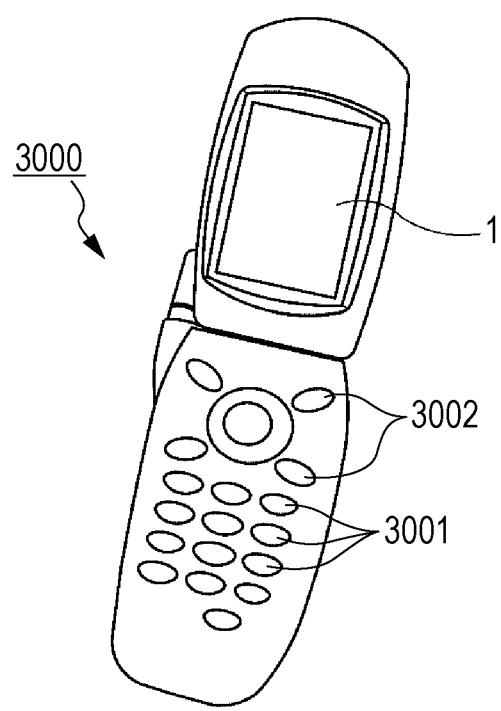
FIG. 17 is a diagram illustrating another example of an electronic instrument.

The present invention is usable for various kinds of electronic instruments. FIG. 15 to FIG. 17 illustrate specific aspects of electronic instruments to which the present invention is applied.

FIG. 15 is a perspective diagram illustrating the appearance of a head mounted display as an electronic instrument employing the electrooptical device of the present invention.

As illustrated in FIG. 15, a head mounted display 300 has temples 310, a bridge 320, and projection optical systems 301L and 301R in the appearance as with common glasses. Although not illustrated, the electrooptical device 1 for a left eye and the electrooptical device 1 for a right eye are provided at positions near the bridge 320 and on the back side of the projection optical systems 301L and 301R, respectively.

FIG. 16 is a perspective diagram of a portable type personal computer using an electrooptical device. A personal computer 2000 has the electrooptical device 1 which displays various kinds of images and a body portion 2010 in which a power switch 2001 and a keyboard 2002 are disposed.

FIG. 17 is a perspective diagram of a cellular phone. A cellular phone 3000 has a plurality of operation buttons 3001 and scroll buttons 3002 and the electrooptical device 1 displaying various kinds of images. By operating the scroll buttons 3002, the screen displayed in the electrooptical device 1 is scrolled. The present invention is also applicable to such a cellular phone.

Examples of electronic instruments to which the present invention is applied include Personal Digital Assistants (PDA) besides the instruments illustrated in FIG. 15 to FIG. 17. In addition thereto, a digital still camera, a television set, a video camera, a car navigation device, an in-vehicle display (instrument panel), an electronic notebook, an electronic paper, a calculator, a word processor, a workstation, a TV phone, and a POS terminal are mentioned. Furthermore, instruments having a printer, a scanner, a copying machine, a video player, and a touch panel and the like are mentioned.

The entire disclosures of Japanese Patent Application No.: 2016-112552, filed Jun. 6, 2016 and 2017-095615, filed May 12, 2017 are expressly incorporated by reference herein.

What is claimed is:

1. An organic electro luminescence (EL) device comprising:
    a first pixel and a second pixel each having a different optical path length, the first pixel and the second pixel each including:
        a reflective layer formed on a surface of a second insulating layer, the reflective layer including a plurality of portions disposed at predetermined intervals,
        a first electrode,
        a second electrode,
        a light emitting function layer provided between the first electrode and the second electrode,
        a protective layer provided between the first electrode and the reflective layer, and
        an optical path length adjusting layer provided between the first electrode and the protective layer, the optical path length adjusting layer having a different film thickness in the first pixel than a film thickness in the second pixel, and the optical path length adjusting layer is a first insulating layer and has a refractive index higher than a refractive index of the protective layer.

2. The organic EL device according to claim 1, wherein a difference between a refractive index of the first electrode and the refractive index of the optical path length adjusting layer is smaller than a difference between the refractive index of the first electrode and the refractive index of the protective layer.

3. An electronic instrument comprising:
    the organic EL device according to claim 2.

4. The organic EL device according to claim 1, wherein the protective layer is in contact with the reflective layer.

5. An electronic instrument comprising:
the organic EL device according to claim 4.

6. The organic EL device according to claim 1, wherein the protective layer is silicon oxide.

7. An electronic instrument comprising:
the organic EL device according to claim 6.

8. The organic EL device according to claim 6, wherein
the optical path length adjusting layer includes a first optical path length adjusting layer provided on the protective layer and a second optical path length adjusting layer provided on the first optical path length adjusting layer,
the first electrode is provided on the second optical path length adjusting layer, and
the first optical path length adjusting layer and the second optical path length adjusting layer are formed of silicon nitride.

9. The organic EL device according to claim 1, wherein
the optical path length adjusting layer contains any material of silicon nitride, titanium oxide, tantalum oxide, aluminum oxide, molybdenum oxide, tungsten oxide, and hafnium oxide.

10. An electronic instrument comprising:
the organic EL device according to claim 9.

11. The organic EL device according to claim 1, further comprising:
a third pixel, which is different than the first pixel and the second pixel, wherein
the third pixel does not contain an optical path length adjusting layer.

12. An electronic instrument comprising:
the organic EL device according to claim 1.

13. The organic EL device according to claim 1, wherein a plurality of embedded oxide layers are attached to a surface of the optical path length adjusting layer.

14. An organic electro luminescence (EL) device comprising:
a first pixel and a second pixel each having a different optical path length, the first pixel and the second pixel each including:
a reflective layer formed on a surface of a second insulating layer, the reflective layer including a plurality of portions disposed at predetermined intervals,
a first electrode,
a second electrode,
a light emitting function layer provided between the first electrode and the second electrode,
an optical path length adjusting layer provided between the first electrode and the reflective layer, the optical path length adjusting layer having a different film thickness in the first pixel than a film thickness in the second pixel, the optical path length adjusting layer being a first insulating layer, and
a protective layer provided between the reflective layer and the optical path length adjusting layer, wherein:
a difference between a refractive index of the first electrode and a refractive index of the optical path length adjusting layer is smaller than a difference between the refractive index of the first electrode and a refractive index of the protective layer.

15. The organic EL device according to claim 14, wherein the protective layer is in contact with the reflective layer.

16. An electronic instrument comprising:
the organic EL device according to claim 15.

17. The organic EL device according to claim 14, wherein the protective layer is silicon oxide.

18. An electronic instrument comprising:
the organic EL device according to claim 17.

19. The organic EL device according to claim 17, wherein
the optical path length adjusting layer includes a first optical path length adjusting layer provided on the protective layer and a second optical path length adjusting layer provided on the first optical path length adjusting layer,
the first electrode is provided on the second optical path length adjusting layer, and
the first optical path length adjusting layer and the second optical path length adjusting layer are formed of silicon nitride.

20. The organic EL device according to claim 14, wherein
the optical path length adjusting layer contains any material of silicon nitride, titanium oxide, tantalum oxide, aluminum oxide, molybdenum oxide, tungsten oxide, and hafnium oxide.

21. An electronic instrument comprising:
the organic EL device according to claim 14.

22. The organic EL device according to claim 14, wherein a plurality of embedded oxide layers are attached to a surface of the optical path length adjusting layer.

* * * * *